(12) United States Patent
Park et al.

(10) Patent No.: US 9,767,753 B2
(45) Date of Patent: Sep. 19, 2017

(54) SCAN DRIVER

(71) Applicant: SAMSUNG DISPLAY CO., LTD., Yongin-si, Gyeonggi-do (KR)

(72) Inventors: Jun Hyun Park, Yongin-si (KR); Keum Nam Kim, Yongin-si (KR); Sung Hwan Kim, Yongin-si (KR); Kyoung Ju Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/135,425

(22) Filed: Apr. 21, 2016

(65) Prior Publication Data

US 2017/0069282 A1 Mar. 9, 2017

(30) Foreign Application Priority Data

Sep. 9, 2015 (KR) ........................ 10-2015-0127853

(51) Int. Cl.
*G09G 3/36* (2006.01)

(52) U.S. Cl.
CPC ... *G09G 3/3677* (2013.01); *G09G 2310/0216* (2013.01)

(58) Field of Classification Search
CPC ...................... G09G 3/3677; G09G 2310/0216
See application file for complete search history.

(56) References Cited

U.S. PATENT DOCUMENTS

| 9,013,390 B2* | 4/2015 | Yang .................... G09G 3/3677 345/100 |
| 2006/0001637 A1 | 1/2006 | Pak et al. |
| 2013/0335392 A1 | 12/2013 | Cho et al. |
| 2015/0348508 A1* | 12/2015 | Her .......................... G09G 5/18 345/205 |
| 2015/0356909 A1* | 12/2015 | Lim ..................... H03K 17/162 345/205 |

FOREIGN PATENT DOCUMENTS

KR  10-2006-0000993 A  1/2006

* cited by examiner

*Primary Examiner* — Andrew Sasinowski
(74) *Attorney, Agent, or Firm* — Lewis Roca Rothgerber Christie LLP

(57) ABSTRACT

A scan driver includes a plurality of stages configured to supply scan signals to scan lines. An ith (i is a natural number) stage of the stages at one side of a panel includes: a first transistor connected between a first input terminal and a first node, and including a gate electrode connected to a second input terminal; a second transistor connected between a third input terminal and a first output terminal for outputting an ith scan signal of the scan signals, and including a gate electrode connected to the first node; a third transistor connected between the first output terminal and a first power input terminal configured to receive a first off voltage, and including a gate electrode connected to the second input terminal; and a first capacitor connected between the first node and the first output terminal.

20 Claims, 12 Drawing Sheets

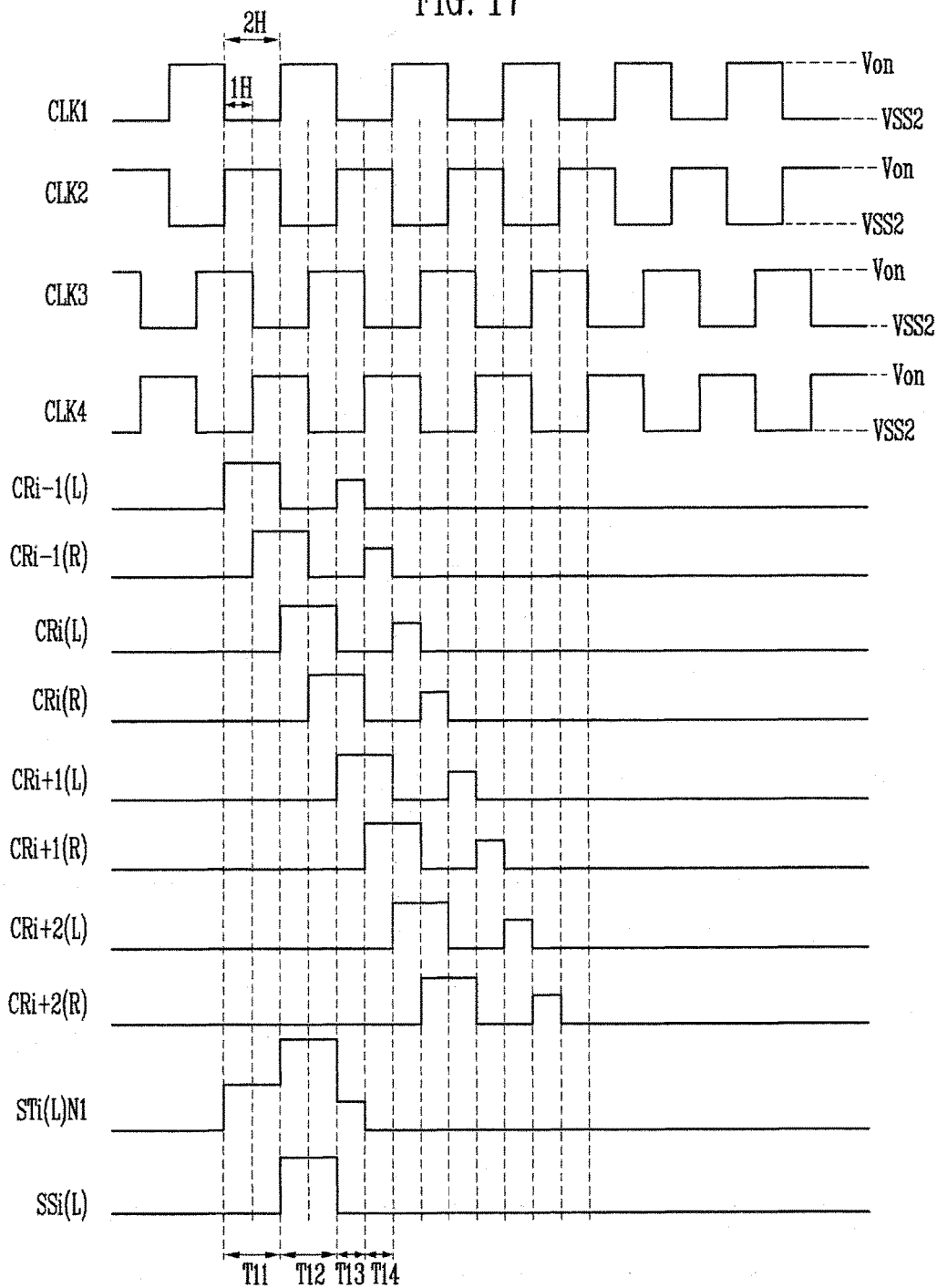

SCAN DRIVER

CROSS-REFERENCE TO RELATED APPLICATION

This application claims priority to and the benefit of Korean Patent Application No. 10-2015-0127853, filed on Sep. 9, 2015 in the Korean Intellectual Property Office, the entire content of which is incorporated herein by reference.

BACKGROUND

1. Field

Aspects of embodiments of the present invention are directed to a scan driver.

2. Description of the Related Art

With the development of information technology, the importance of display devices, which are a connection medium between users and information, has increased. In line with this, use of display devices, such as Liquid Crystal Display (LCD) devices or Organic Light Emitting Diode (OLED) display devices has increased.

In general, a display device includes a data driver for supplying data signals to data lines, a scan driver for supplying scan signals to scan lines, and a display unit including pixels located in a display area defined by the scan lines and the data lines. Each of the pixels included in the display unit is selected when a scan signal is supplied to a corresponding scan line and is driven when a corresponding data signal is received from a corresponding data line. The pixel then supplies light to the outside with luminance corresponding to the received data signal.

In a display device, components such as the scan driver may have to occupy a set or predetermined area (such as a mounting area) and thus, reducing or minimizing the size of the scan driver may be desired.

SUMMARY

Accordingly, embodiments of the present invention provide for a scan driver for which the size (such as the size of the circuit area) may be reduced or minimized. Further embodiments provide for a scan driver using stages, such as one stage for each scan line, that may have a reduced or minimal number of transistors and that may stably drive the scan lines.

According to an embodiment of the present invention, a scan driver is provided. The scan driver includes a plurality of stages configured to supply scan signals to scan lines. An $i^{th}$ (I is a natural number) stage of the stages at one side of a panel includes: a first transistor connected between a first input terminal and a first node, and including a gate electrode connected to a second input terminal; a second transistor connected between a third input terminal and a first output terminal for outputting an $i^{th}$ scan signal of the scan signals, and including a gate electrode connected to the first node; a third transistor connected between the first output terminal and a first power input terminal configured to receive a first off voltage, and including a gate electrode connected to the second input terminal; and a first capacitor connected between the first node and the first output terminal.

In the $i^{th}$ stage, the third input terminal may be configured to receive a first clock signal and the second input terminal may be configured to receive a second clock signal. In a $(i-1)^{th}$ stage of the stages, the second input terminal may be configured to receive the first clock signal and the third input terminal may be configured to receive the second clock signal.

A phase of the first clock signal may be reversed from a phase of the second clock signal.

The $i^{th}$ stage may further include a fourth transistor connected between the first output terminal and the first power input terminal, and including a gate electrode connected to a fourth input terminal.

The first input terminal may be configured to receive a $(i-1)^{th}$ scan signal of the scan signals from a $(i-1)^{th}$ stage of the stages. The fourth input terminal may be configured to receive a $(i+2)^{th}$ scan signal of the scan signals from a $(i+2)^{th}$ stage of the stages.

The stages may be further configured to supply carry signal. The $i^{th}$ stage may further include: a fourth transistor connected between the first power input terminal and a second output terminal for outputting an $i^{th}$ carry signal of the carry signals, and including a gate electrode connected to a fourth input terminal; a fifth transistor connected between the third input terminal and the second output terminal, and including a gate electrode connected to the first node; and a sixth transistor connected between the second output terminal and a second power input terminal configured to receive a second off voltage, and including a gate electrode connected to the second input terminal.

The first off voltage and the second off voltage may be the same voltage.

The second off voltage may be a lower voltage than the first off voltage.

The first input terminal may be configured to receive a $(i-1)^{th}$ carry signal of the carry signals from a $(i-1)^{th}$ stage of the stages. The third input terminal may be configured to receive a first clock signal. The second input terminal may be configured to receive a second clock signal. The fourth input terminal may be configured to receive a $(i+2)^{th}$ carry signal of the carry signals from a $(i+2)^{th}$ stage of the stages.

The first clock signal and the second clock signal may be signals having reversed phases, and alternating between a gate on voltage during a high section and the second off voltage during a low section.

The first transistor may include a plurality of transistors serially connected together.

The $i^{th}$ stage may further include a seventh transistor connected between a second node between the plurality of transistors and the second output terminal, and including a gate electrode connected to the second output terminal.

The $i^{th}$ stage may further include: an eighth transistor connected between the first node and the first power input terminal or the second output terminal, and including a gate electrode connected to a reset input terminal; a ninth transistor connected between the first output terminal and the first power input terminal or the second output terminal, and including a gate electrode connected to the reset input terminal; and a tenth transistor connected between the second output terminal and the first power input terminal or the second output terminal, and including a gate electrode connected to the reset input terminal.

The stages may include left stages at the one side of the panel and connected to odd-numbered ones of the scan lines, and right stages at another side of the panel and connected to even-numbered ones of the scan lines.

The left stages may be configured to be driven by a first clock signal and a second clock signal that has a reverse phase of the first clock signal. The right stages may be configured to be driven by a third clock signal that lags the first clock signal by one horizontal period, and a fourth clock signal that has a reverse phase of the third clock signal.

One cycle of each of the first clock signal, the second clock signal, the third clock signal, and the fourth clock signal may include a high section of two horizontal periods and a low section of two horizontal periods.

In an $i^{th}$ left stage of the left stages, the second input terminal may be configured to receive the second clock signal and the third input terminal may be configured to receive the first clock signal. In a $(i-1)^{th}$ left stage of the left stages, the second input terminal may be configured to receive the first clock signal and the third input terminal may be configured to receive the second clock signal. In an $i^{th}$ right stage of the right stages, the second input terminal may be configured to receive the fourth clock signal and the third input terminal may be configured to receive the third clock signal. In a $(i-1)^{th}$ right stage of the right stages, the second input terminal may be configured to receive the third clock signal and the third input terminal may be configured to receive the fourth clock signal.

The stages may be further configured to supply carry signals. An $i^{th}$ left stage of the left stages may further include: a fourth transistor connected between a second output terminal for outputting an $i^{th}$ left carry signal of the carry signals and a second power input terminal configured to receive a second off voltage, and including a gate electrode connected to a fourth input terminal; a fifth transistor connected between the third input terminal and the second output terminal, and including a gate electrode connected to the first node; and a sixth transistor connected between the second output terminal and the second power input terminal, and including a gate electrode connected to the second input terminal.

The second off voltage may be a lower voltage than the first off voltage.

The first input terminal may be configured to receive a $(i-1)^{th}$ left carry signal of the carry signals from a $(i-1)^{th}$ left stage of the left stages. The fourth input terminal may be configured to receive a $(i+2)^{th}$ right carry signal of the carry signals from a $(i+2)^{th}$ right stage of the right stages.

According to scan drivers of the above and other embodiments of the present invention, each stage for supplying a scan signal may include 10 or fewer transistors. As such, scan driver stages of embodiments of the present invention may be implemented as comparatively simple circuits and thus, it may be possible to reduce or minimize the size of scan drivers using such scan driver stages.

BRIEF DESCRIPTION OF THE DRAWINGS

Example embodiments will now be described more fully hereinafter with reference to the accompanying drawings.

FIG. 17 is a waveform diagram illustrating an example method of driving the stage of FIG. 16 according to an embodiment of the present invention.

DETAILED DESCRIPTION

Figure 1:
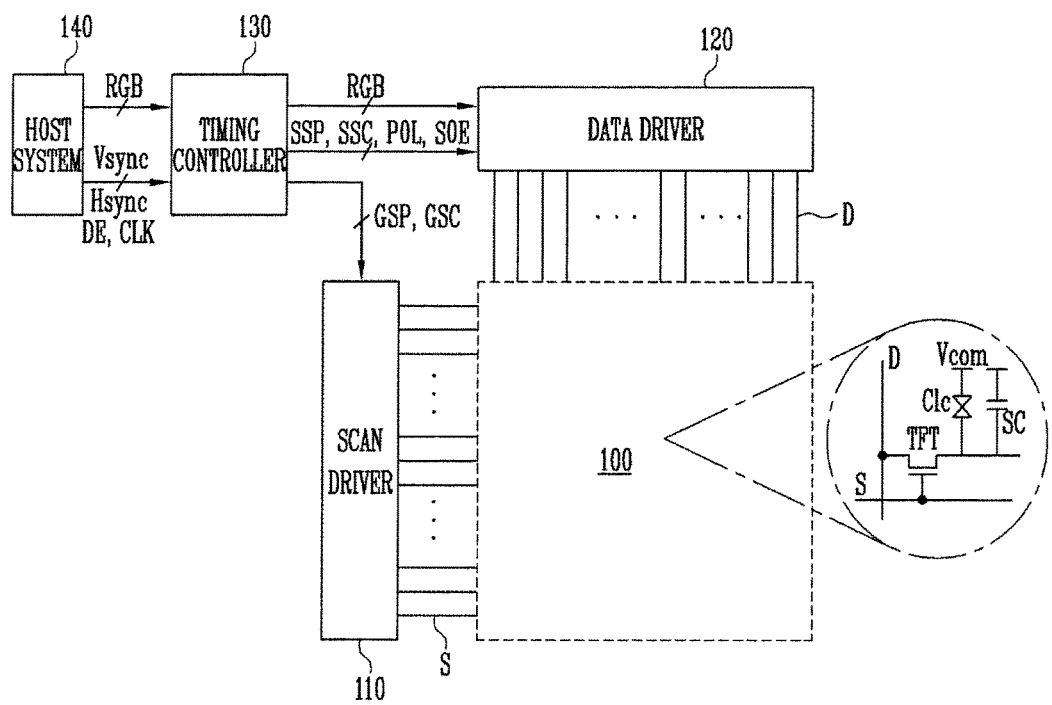
FIG. 1 is a block diagram schematically illustrating an example display device according to an embodiment of the present invention.

Example embodiments of the present invention will now be described more fully hereinafter with reference to the accompanying drawings; however, the invention may be embodied in different forms and should not be construed as limited to the embodiments set forth herein. Rather, these embodiments are provided to more thoroughly convey the scope of the present invention to those skilled in the art.

In the drawings, dimensions may be exaggerated for clarity of illustration. It will be understood that when an element is referred to as being "between" two elements, it may be the only element between the two elements, or one or more intervening elements may also be present. Like or similar reference numerals refer to like or similar elements throughout.

Detailed descriptions of relevant known functions or configurations that may unnecessarily obscure aspects of the present invention may be omitted. Further, names of constituent elements used in the present description may be selected in consideration of ease of writing the specification and thus, may be different from names of components of an actual product.

The present invention is not limited to the described embodiments, but may be implemented in different forms. Throughout this specification and the claims that follow, when it is described that an element is "connected" to another element, the element may be "directly connected" to the other element or indirectly connected (e.g., "electrically connected") to the other element through one or more third elements. In the following description, the same or similar elements will be designated by the same or similar reference numerals although they are shown in different drawings.

Terms such as "connected" and "coupled" may refer to either a physical connection or an electrical connection depending on context, as would be apparent to one of ordinary skill. Further, "electrically connected" or "electrically coupled" may refer to circuits that are conductively coupled or resistively coupled (e.g., capable of transmitting current, or maintaining substantially the same voltage level throughout, etc.) or may further refer to circuits that are capacitively coupled (e.g., connected through a capacitor, where current does not flow through the capacitor or different voltage levels are on both sides of the capacitor), depending on context, as would be apparent to one of ordinary skill.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

In the description, unless otherwise stated, the supply of a specific transistor-driving signal (for example, a clock signal) refers to a gate-on voltage of that signal (e.g., capable of turning on a transistor if transmitted to the gate electrode of the transistor), while the interruption of the supply of the signal (or the not supplying of the signal) refers to a gate-off voltage of that signal (e.g., capable of turning off a transistor if transmitted to the gate electrode of the transistor).

In the description, a scan driver may include stages connected to corresponding scan lines. The stages may supply scan signals to the corresponding scan lines in response to signals from a timing controller. To this end, each of the stages may be formed of P-type (for example, PMOS) or N-type (for example, NMOS) transistors (or both), and may be formed on a panel concurrently with pixels.

FIG. 1 is a block diagram schematically illustrating an example display device according to an embodiment of the present invention. For convenience of description, in FIG. 1, it is assumed that the display device is a liquid crystal display (LCD) device, but the present invention is not limited thereto. For example, in other embodiments, the display device may be an organic light emitting display device.

Referring to FIG. 1, the display device may include a display unit 100, a scan driver 110, a data driver 120, a timing controller 130, and a host system 140. The display unit 100 may refer to an effective display unit of the liquid crystal panel. The liquid crystal panel may include a Thin Film Transistor (TFT) substrate and a color filter substrate. A liquid crystal layer may be formed between the TFT substrate and the color filter substrate. Data lines D and scan lines S may be formed on the TFT substrate, and a plurality of pixels may be disposed in areas defined by the scan lines S and the data lines D (e.g., at crossing regions of the scan lines S and the data lines D).

A TFT included in each of the pixels may transmit a voltage of a data signal supplied via a data line D in response to a scan signal from a scan line S to a liquid crystal capacitor Clc. To this end, a gate electrode of the TFT may be connected to the scan line S and a first electrode thereof may be connected to the data line D. Further, a second electrode of the TFT may be connected to the liquid crystal capacitor Clc and a storage capacitor SC.

Here, the first electrode refers to one of a source electrode and a drain electrode of the TFT, and the second electrode refers to a different one of the source electrode and the drain electrode of the TFT. For example, when the first electrode is the drain electrode, the second electrode is the source electrode. Further, the liquid crystal capacitor Clc may be a capacitor equivalently expressing, for example, a capacitance formed in a liquid crystal layer between a common electrode (having a common voltage Vcom) formed on the color filter substrate and a pixel electrode formed on the TFT substrate. The storage capacitor SC may maintain a voltage of a data signal transmitted to the pixel electrode until a next data signal is supplied.

Black matrix, color filters, or the like may be formed on the color filter substrate. The common electrode may be formed on the color filter substrate in a vertical field effect driving method, such as a Twisted Nematic (TN) mode or a Vertical Alignment (VA) mode, or may be formed on the TFT substrate together with the pixel electrode in a horizontal field effect driving method, such as an In Plane Switching (IPS) mode or a Fringe Field Switching (FFS) mode. A common voltage Vcom may be supplied to the common electrode. Further, a liquid crystal mode of the liquid crystal panel may include any kind of liquid crystal mode in place of the aforementioned TN mode, VA mode, IPS mode, and FFS mode.

The data driver 120 may convert image data (RGB) input from the timing controller 130 into positive/negative gamma compensated voltages and generate positive/negative analog data voltages. The positive/negative analog data voltages generated by the data driver 120 may be supplied to the data lines D as data signals.

Figure 2:
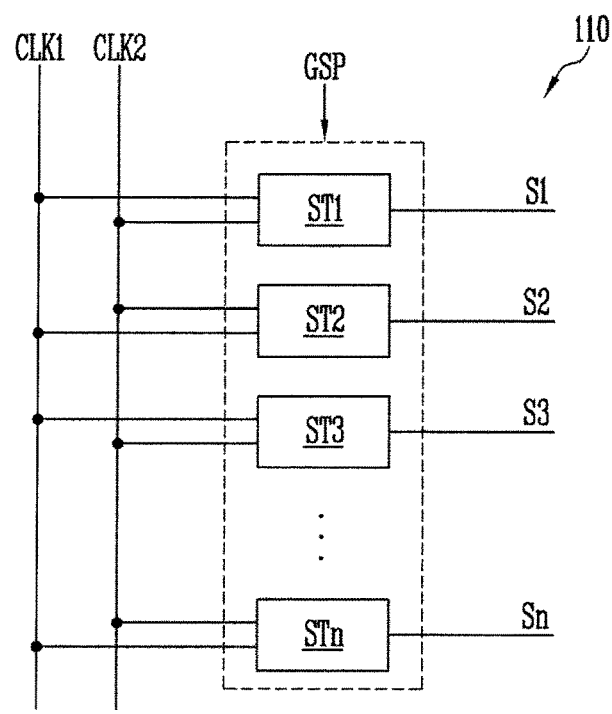
FIG. 2 is a block diagram illustrating an example scan driver of FIG. 1 according to an embodiment of the present invention.

The scan driver 110 may supply scan signals to the scan lines S. For example, the scan driver 110 may sequentially supply scan signals to the scan lines S. When the scan signals are sequentially supplied to the scan lines S, the pixels may be selected in units of horizontal lines (for example, one horizontal line each horizontal period 1H), and the pixels selected by the scan signals may receive the data signals in one horizontal period. To this end, the scan driver 110 may include stages ST connected to corresponding ones of the scan lines S, as illustrated in FIG. 2 (where an $i^{th}$ stage STi is connected to an $i^{th}$ scan line Si). The scan driver 110 may be formed (e.g., embedded) in the liquid crystal panel as an Amorphous Silicon Gate (ASG) driver. For example, the scan driver 110 may be embedded in the TFT Substrate through a thin film process. In other embodiments, the scan driver 110 may be formed (e.g., embedded) at both sides of the liquid crystal panel with the display unit 100 interposed therebetween.

The timing controller 130 may supply gate control signals to the scan driver 110 and data control signals to the data driver 120 based on the image data (RGB) and timing signals, such as a vertical synchronization signal (Vsync), a horizontal synchronization signal (Hsync), a data enable signal (DE), and a clock signal (CLK), output from the host system 140.

The gate control signals may include a Gate Start Pulse (GSP), one or more Gate Shift Clocks (GSC), and the like. The gate start pulse may control timing of the first scan signal. The gate shift clocks may refer to one or more clock signals for shifting the gate start pulse.

The data control signals may include a Source Start Pulse (SSP), a Source Sampling Clock (SSC), a Source Output Enable (SOE) signal, a Polarity Control (POL) signal, and the like. The source start pulse may control a start time of data sampling of the data driver 120. The source sampling clock may control a sampling operation of the data driver 120 based on a rising or falling edge. The source output enable signal may control an output timing of the data driver 120. The polarity control signal may reverse polarity of the data signals output from the data driver 120.

The host system 140 may supply image data to the timing controller 130 through an interface, such as Low. Voltage Differential Signaling (LVDS) or Transition Minimized Differential Signaling (TMDS). Further, the host system 140 may supply the timing signals (e.g., Vsync, Hsync, DE, and CLK) to the timing controller 130.

FIG. 2 is a block diagram illustrating an example scan driver 110 of FIG. 1 according to an embodiment of the present invention.

Referring to FIG. 2, the scan driver 110 may include a plurality of stages ST1 to STn. Each of the first to $n^{th}$ stages ST1 to STn may be connected to a corresponding one of the first to $n^{th}$ scan lines S1 to Sn, and supply a scan signal to the corresponding scan line in response to the gate start pulse or a previous scan signal. Here, the $i^{th}$ stage STi (i is a natural number) may supply a scan signal to the $i^{th}$ scan line Si.

In further detail, each of the first to $n^{th}$ stages ST1 to STn may receive first and second clock signals CLK1 and CLK2 from the timing controller 130 as the gate shift clocks. For example, the odd-numbered (or odd) stages ST1, ST3, . . . , may receive the second clock signal CLK2 through the second input terminal 1122 illustrated in FIG. 3 and the first clock signal CLK1 through the third input terminal 1123 illustrated in FIG. 3. Further, the even-numbered (or even) stages ST2, ST4, . . . , may receive the first clock signal CLK1 through the second input terminal 1122 and the second clock signal CLK2 through the third input terminal 1123.

Figure 5:
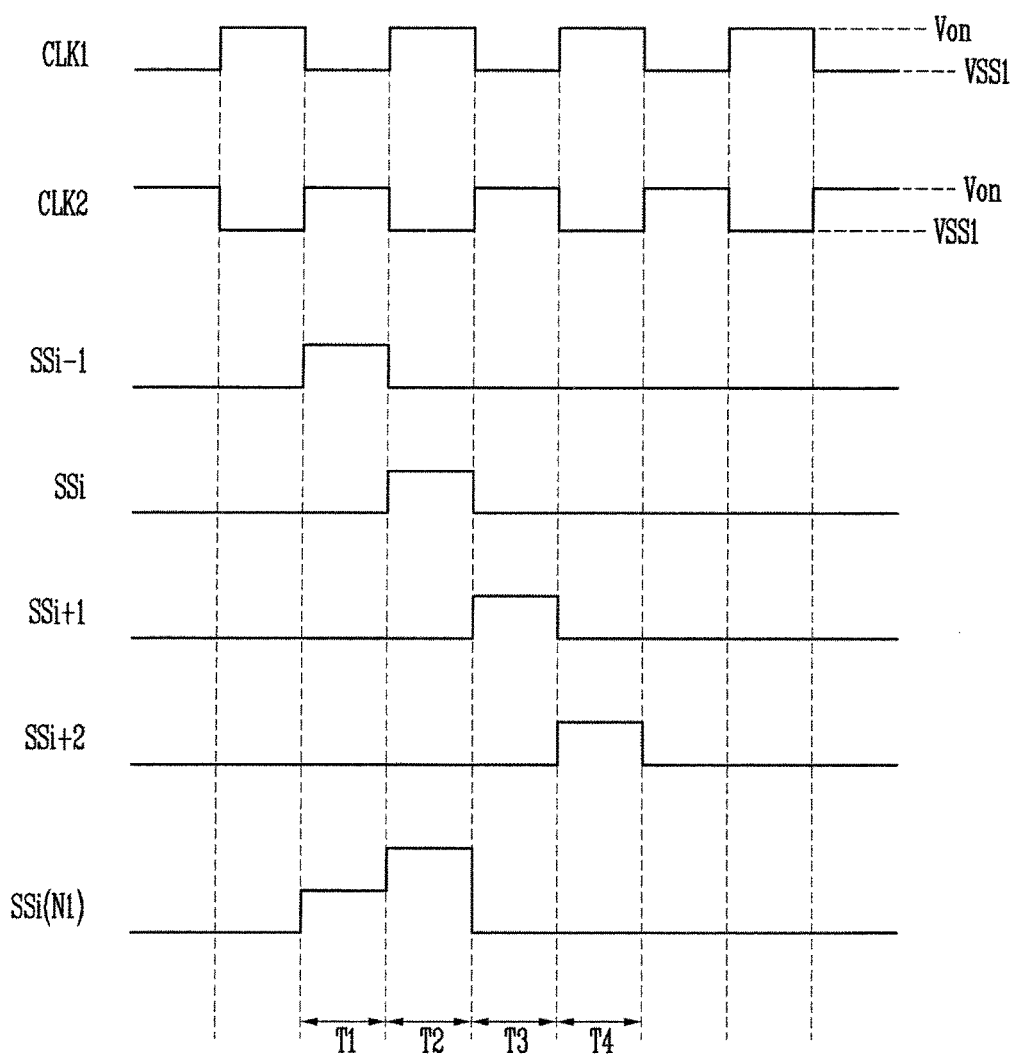
FIG. 5 is a waveform diagram illustrating an example method of driving the stage of FIG. 4 according to an embodiment of the present invention.

The first clock signal CLK1 may be a square wave signal in which a cycle including a high section and a low section is repeated as illustrated in FIG. 5. The high section of the first clock signal CLK1 may be a gate on voltage Von and the low section of the first clock signal CLK1 may be a first off voltage VSS1 (or gate off voltage). Here, the gate on voltage Von may refer to a voltage for which (when applied to the gate electrodes) the transistors included in the $i^{th}$ stage STi are turned on and the first off voltage VSS1 may refer to a voltage for which (when applied to the gate electrodes) the transistors included in the $i^{th}$ stage STi are turned off.

In a similar fashion, the second clock signal CLK2 may be a square wave signal in which a high section and a low section are repeated. The high section of the second clock signal CLK2 may be the gate on voltage Von and the low section of the second clock signal CLK2 may be the first off voltage VSS1. Here, the second clock signal CLK2 may be generated so that the phase of the second clock signal CLK2 is reversed with the phase of the first clock signal CLK1 (e.g., the first and second clock signals CLK1 and CLK2 may be signals having reversed phases).

While FIG. 2 illustrates the n stages ST1 to STn, the present invention is not limited thereto. For example, in other embodiments, the scan driver 110 may additionally include dummy stages, such as ST0, STn+1, and STn+2 in order to secure stability of the driving (e.g., providing signals from a previous stage to the first stage ST1, or signals from later stages to the $n^{th}$ stage STn).

Figure 3:
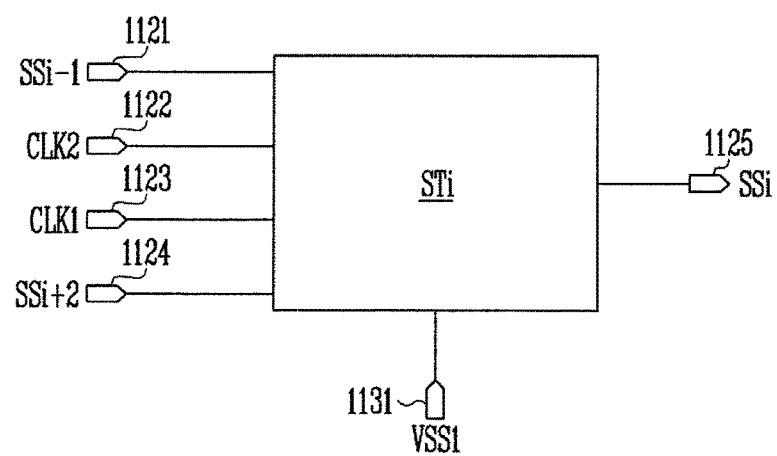
FIG. 3 is a block diagram illustrating an example set of stage terminals of a scan driver stage of FIG. 2.

FIG. 3 is a block diagram illustrating an example set of stage terminals of an $i^{th}$ scan driver stage STi of FIG. 2. For convenience of description, the stage terminals in FIG. 3 are for an odd-numbered stage STi (e.g., when i is an odd number). The corresponding set of terminals for an even-numbered stage STi+1 are similar to those of the odd-numbered stage STi, with differences discussed elsewhere and as would be apparent to one of ordinary skill.

Referring to FIG. 3, the $i^{th}$ stage STi includes a first input terminal 1121, a second input terminal 1122, a third input terminal 1123, a fourth input terminal 1124, a first output terminal 1125, and a first power input terminal 1131. The first input terminal 1121 may receive a $(i-1)^{th}$ scan signal SSi-1 from a previous stage STi-1. To this end, the first input terminal 1121 of the $i^{th}$ stage STi is electrically connected to the first output terminal 1125 of the $(i-1)^{th}$ stage STi-1. In addition, when the $i^{th}$ stage STi is the first stage ST1, the gate start pulse may be supplied to the first input terminal 1121.

The second input terminal 1122 may receive the second clock signal CLK2. In this case, the first clock signal CLK1 may be supplied to the second input terminal 1122 of the previous stage STi-1 (an even stage). Likewise, the third input terminal 1123 (of the $i^{th}$ stage STi) may receive the first clock signal CLK1, in which case the second clock signal CLK2 may be supplied to the third input terminal 1123 of the previous stage STi-1. In addition, the fourth input terminal 1124 may receive the $(i+2)^{th}$ scan signal SSi+2 from the $(i+2)^{th}$ stage STi+2.

The first output terminal 1125 may supply the $i^{th}$ scan signal SSi of the $i^{th}$ stage STi to the $i^{th}$ scan line Si. In addition, the $i^{th}$ scan signal SSi may be supplied to the fourth input terminal 1124 of the $(i-2)^{th}$ stage STi-2 and the first input terminal 1121 of the $(i+1)^{th}$ stage STi+1. Further, the first power input terminal 1131 may receive the first off voltage VSS1.

Figure 4:
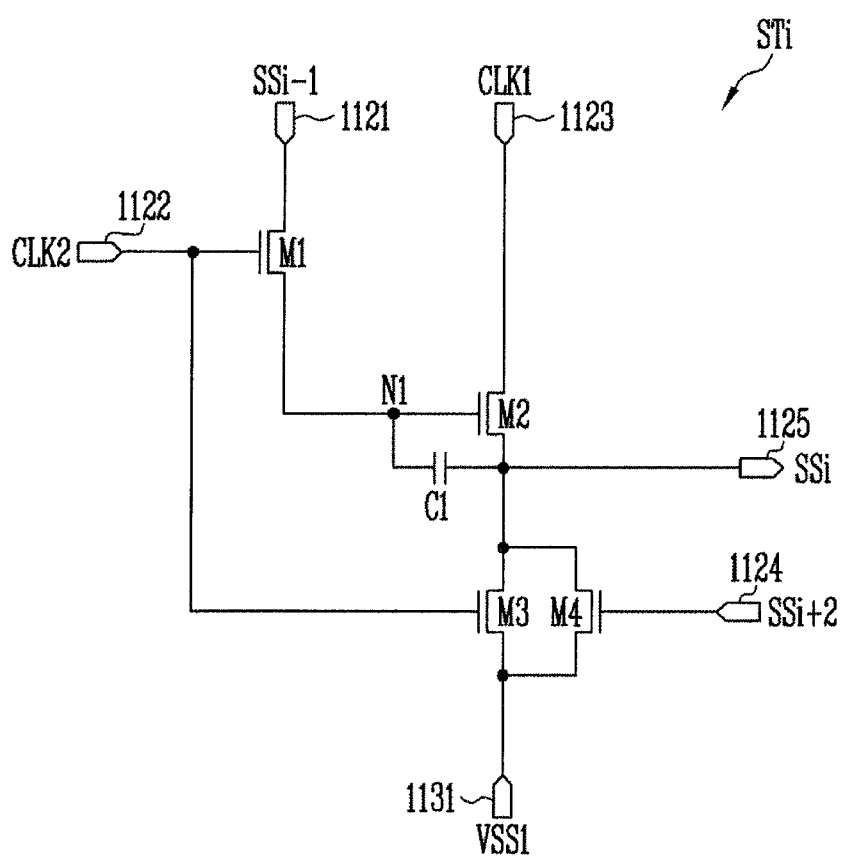
FIG. 4 is a circuit diagram illustrating an example circuit layout of the stage of FIG. 3 according to an embodiment of the present invention.

FIG. 4 is a circuit diagram illustrating an example circuit layout of the $i^{th}$ stage STi of FIG. 3 according to an embodiment of the present invention. As with FIG. 3, for convenience of description, the stage terminals in FIG. 4 are for an odd-numbered stage STi (e.g., when i is an odd number). The corresponding set of terminals for an even-numbered stage STi+1 are similar to those of the odd-numbered stage STi, with differences discussed elsewhere and as would be apparent to one of ordinary skill. In FIG. 4, first to fourth transistors M1 to M4 constituting the $i^{th}$ stage STi may be formed, for example, of an N-channel Metal Oxide Semiconductor (NMOS).

Referring to FIG. 4, the $i^{th}$ stage STi may include the first to fourth transistors M1 to M4 and a first capacitor C1. The first transistor M1 may be connected between the first input terminal 1121 and a first node N1. Further, a gate electrode of the first transistor M1 may be connected to the second input terminal 1122. When the second. clock signal CLK2 is supplied to the second input terminal 1122, the first transistor M1 may be turned on to electrically connect the first input terminal 1121 and the first node. N1.

The second transistor M2 may be connected between the third input terminal 1123 and the first output terminal 1125. In addition, a gate electrode of the second transistor M2 may be connected to the first node N1. The second transistor M2 may control a connection between the third input terminal 1123 and the first output terminal 1125 while being turned on or turned off in response to the voltage of the first node N1.

The third transistor M3 may be connected between the first output terminal 1125 and the first power input terminal 1131. Further, a gate electrode of the third transistor M3 may be connected to the second input terminal 1122. When the second clock signal CLK2 is supplied to the second input terminal 1122, the third transistor M3 may be turned on to electrically connect the first output terminal 1125 and the first power input terminal 1131.

The fourth transistor M4 may be connected between the first output terminal 1125 and the first power input terminal 1131. Further, a gate electrode of the fourth transistor M4 may be connected to the fourth input terminal 1124. When the $(i+2)^{th}$ scan signal SSI+2 is supplied to the fourth input terminal 1124, the fourth transistor M4 may be turned on to electrically connect the first output terminal 1125 and the first power input terminal 1131.

The first capacitor C1 may be connected between the first node N1 and the first output terminal 1125. The first capacitor C1 may control the voltage of the first node N1, such as when the first node N1 is electrically disconnected (e.g., floated) from the first input terminal 1121 or in response to a voltage of the first output terminal 1125.

The $i^{th}$ stage STi of FIG. 4 includes the four transistors M1 to M4 and one capacitor C1. That is, the $i^{th}$ stage STi of FIG. 4 is implemented by a relatively simple circuit and thus, the size of a corresponding scan driver using such stages may be reduced or minimized.

FIG. 5 is a waveform diagram illustrating an example method of driving the $i^{th}$ stage STi of FIG. 4 according to an embodiment of the present invention. As with FIGS. 3-4, for convenience of description, the signal waveforms of FIG. 5 are for an odd-numbered stage STi (e.g., when i is an odd number). The corresponding signal waveforms for an even-numbered stage STi+1 are similar to those of the odd-numbered stage STi, with differences discussed elsewhere and as would be apparent to one of ordinary skill.

Referring to FIGS. 4-5, in a first period T1, the $(i-1)^{th}$ scan signal SSi-1 is supplied to the first input terminal 1121 and the second clock signal CLK2 is supplied to the second input terminal 1122. When the second clock signal CLK2 is supplied to the second input terminal 1122, the first transistor M1 and the third transistor M3 are turned on. When the first transistor M1 is turned on, the first input terminal 1121 and the first node N1 are electrically connected. Accordingly, the $(i-1)^{th}$ scan signal SSi-1 (having the gate on voltage Von) is supplied to the first node N1.

When the gate on voltage Von of the $(i-1)^{th}$ scan signal SSi-1 is supplied to the first node N1, the second transistor M2 is turned on. When the second transistor M2 is turned on, the third input terminal 1123 (supplying the first clock signal CLK1) and the first output terminal 1125 are electrically connected. In the first period T1, the third input terminal 1123 is the first off voltage VSS1 of the first clock signal CLK1 and thus, the first off voltage VSS1 is supplied to the first output terminal 1125 as the $i^{th}$ scan signal SSi. In addition, when the third transistor M3 is turned on, the first off voltage VSS1, this time from the first power input terminal 1131, is also supplied to the first output terminal 1125. Consequently, the first capacitor C1 stores a voltage corresponding to the gate on voltage Von during the first period T1.

During a second period T2, the first clock signal CLK1 is supplied to the third input terminal 1123 and the second clock signal CLK2 is not supplied to the second input terminal 1122. In this case, the first and third transistors M1 and M3 are turned off, but the first node N1 may maintain at least the gate on voltage Von from the first capacitor C1 and thus, the second transistor M2 may remain turned on, so the first clock signal CLK1 may be supplied to the first output terminal 1125 and then to the $i^{th}$ scan line Si as the $i^{th}$ scan signal SSi. Consequently, the voltage of the first node N1 may be increased to a high voltage Vhigh that is higher than the gate on voltage Von by boosting of the first capacitor C1 during the second period T2 and thus, the second transistor M2 may stably remain turned on.

During a third period T3, the second clock signal CLK2 is supplied to the second input terminal 1122, so the first transistor M1 and the third transistor M3 are turned on. When the first transistor M1 is turned on, the first input terminal 1121 and the first node N1 are electrically connected, so the $(i-1)^{th}$ scan signal SSi-1 is supplied to the first node N1. In this case, the fourth transistor M4 in the $(i-1)^{th}$ stage STi-1 is turned on by the $(i+1)^{th}$ scan signal SSi+1 supplied to the fourth input terminal 1124 of the $(i-1)^{th}$ stage and thus, the first off voltage VSS1 is supplied to the first output terminal 1125 of the $(i-1)^{th}$ stage STi-1 and then as the $(i-1)^{t1}$ scan signal SSi-1.

Accordingly, the first off voltage VSS1 is supplied to the first node N1 during the third period T3. When the first off voltage VSS1 is supplied to the first node N1, the second transistor M2 is turned off. Further, when the third transistor M3 is turned on (by the second clock signal CLK2), the first off voltage VSS1 from the first power input terminal 1131 is supplied to the first output terminal 1125, which interrupts the supply of the $i^{th}$ scan signal SSi to the $i^{th}$ scan line Si.

During a fourth period T4, the $(i+2)^{th}$ scan signal SSi+2 is supplied to the fourth input terminal 1124, the first clock signal CLK1 is supplied to the third input terminal 1123, and the second clock signal CLK2 is not supplied to the second input terminal 1122. Accordingly, the first and third transistors M1 and M3 are turned off, and the voltage of the first node N1 remains at the first off voltage VSS1. Consequently, the second transistor M2 is turned off during the fourth period T4, so the first clock signal CLK1 (supplied to the third input terminal 1123) is not supplied to the first output terminal 1125.

Further, when the $(i+2)^{th}$ scan signal SSi+2 is supplied to the fourth input terminal 1124, the fourth transistor M4 is turned on and thus, the first off voltage VSS1 is supplied to the first output terminal 1125. In addition, each of the first to $n^{th}$ stages ST1 to STn of FIGS. 3-5 may be driven in response to the first period T1 to the fourth period T4 as discussed above.

Figure 6:
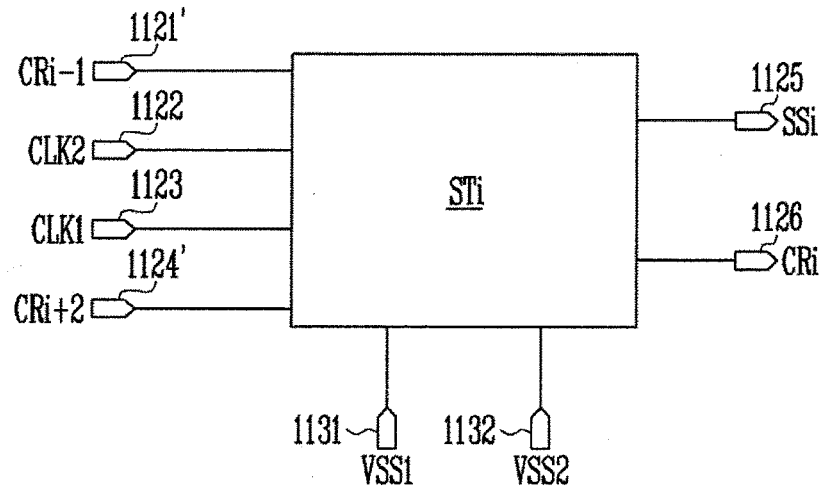
FIG. 6 is a block diagram illustrating an example set of stage terminals of a scan driver stage of FIG. 2 according to another embodiment of the present invention.

FIG. 6 is a block diagram illustrating an example set of the stage terminals of an $i^{th}$ scan driver stage STi of FIG. 2 according to another embodiment of the present invention. For convenience of description, the stage terminals of FIG. 6 are for an odd-numbered stage STi (e.g., when i is an odd number). The corresponding set of terminals for an even-numbered stage STi+1 are similar to those of the odd-numbered stage STi, with differences discussed elsewhere and as would be apparent to one of ordinary skill. In addition, the $i^{th}$ stage STi of FIG. 6 uses an $i^{th}$ carry signal CRi to drive other stages instead of the $i^{th}$ scan signal SSi used in the $i^{th}$ stage STi of FIG. 3.

In general, carry signals are similar to scan signals, only when carry signals are present in an embodiment, they may be used in place of the scan signals to drive other stages of the scan driver. In most other respects, the connection relation of the $i^{th}$ stage STi of FIG. 6 is similar to that of the $i^{th}$ stage STi of FIG. 3. Accordingly, elements having substantially the same configuration as that of FIG. 3 will be denoted with the same reference numeral.

Referring to FIG. 6, the $i^{th}$ stage STi includes a first input terminal 1121', a second input terminal 1122, a third input terminal 1123, a fourth input terminal 1124', a first output terminal 1125, a second output terminal 1126, a first power input terminal 1131, and a second power input terminal 1132. The first input terminal 1121' receives a $(i-1)^{th}$ carry signal CRi-1 from the previous stage STi-1. To this end, the first input terminal 1121' of the $i^{th}$ stage STi is electrically connected to the second output terminal 1126 of the $(i-1)^{th}$ stage STi-1.

The second input terminal 1122 receives the second clock signal CLK2. In this case, the first clock signal CLK1 is supplied to the second input terminal 1122 of the previous stage STi-1 (an even stage). The third input terminal 1123 (of the $i^{th}$ stage STi) receives the first clock signal CLK1. In this case, the second clock signal CLK2 is supplied to the third input terminal 1123 of the previous stage STi-1 (an even stage). The fourth input terminal 1124' receives the $(i+2)^{th}$ carry signal CRi+2 from the $(i+2)^{th}$ stage STi+2.

The first output terminal 1125 supplies the $i^{th}$ scan signal SSi of the $i^{th}$ stage STi to the $i^{th}$ scan line Si. The second output terminal 1126 outputs the $i^{th}$ carry signal CRi. The $i^{th}$ carry signal CRi is supplied to the fourth input terminal 1124' of the $(i-2)^{th}$ stage STi-2 and the first input terminal 1121' of the $(i+1)^{th}$ stage STi+1.

The first power input terminal 1131 receives a first off voltage VSS1. The second power input terminal 1132 receives a second off voltage VSS2 (or gate off voltage). Here, the second off voltage VSS2 may be a lower voltage than the first off voltage VSS1, and may be a voltage configured to turn off a transistor when applied to the gate electrode of the transistor. In addition, in some embodiments, the first off voltage VSS1 and the second off voltage VSS2 may be used for stable driving, but the present invention is not limited thereto. For example, in other embodiments, the first off voltage VSS1 may also be supplied to the second power input terminal 1132 or the second off voltage VSS2 may also be supplied to the first power input terminal 1131.

Figure 7:
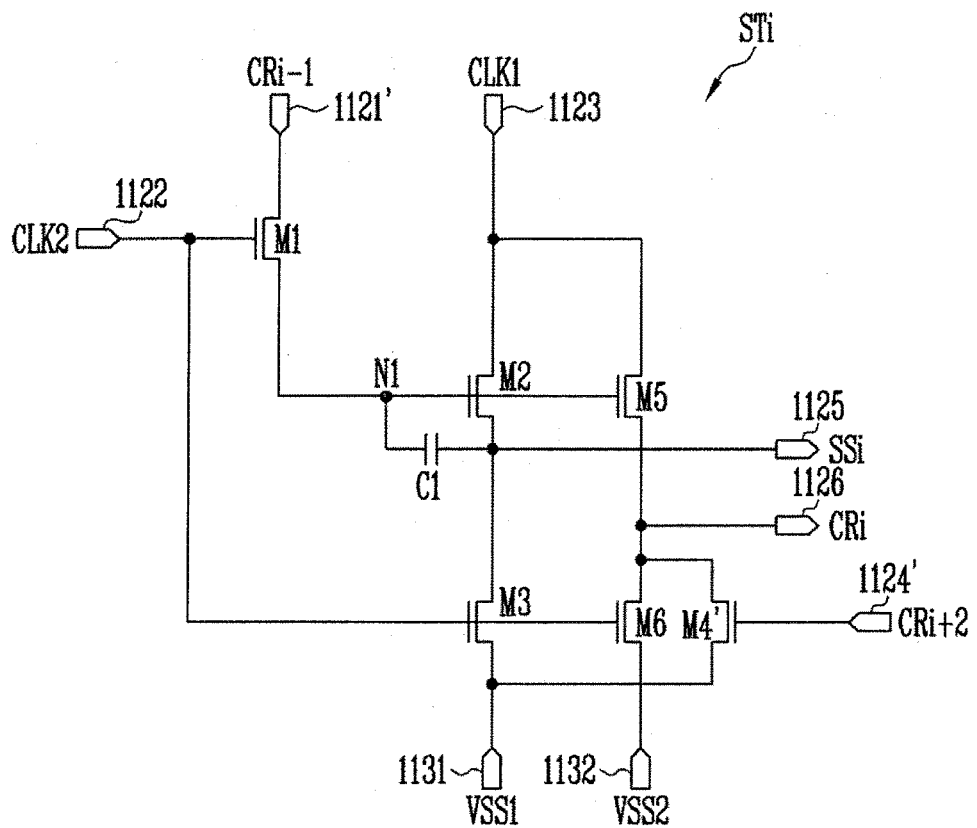
FIG. 7 is a circuit diagram illustrating an example circuit layout of the stage of FIG. 6 according to a first embodiment of the present invention.

FIG. 7 is a diagram illustrating an example circuit layout of the $i^{th}$ stage STi of FIG. 6 according to a first embodiment of the present invention. As with FIG. 6, for convenience of description, the stage terminals in FIG. 7 are for an odd-numbered stage STi (e.g., when i is an odd number). The corresponding set of terminals for an even-numbered stage STi+1 are similar to those of the odd-numbered stage STi, with differences discussed elsewhere and as would be apparent to one of ordinary skill. In FIG. 7, first to sixth transistors M1 to M6 constituting the $i^{th}$ stage STi may be formed, for example, of an N-channel Metal Oxide Semiconductor (NMOS).

Referring to FIG. 7, the $i^{th}$ stage STi may include a first transistor M1 to a sixth transistor M6 and a first capacitor C1. The first transistor M1 may be connected between the first input terminal 1121' and a first node N1. Further, a gate electrode of the first transistor M1 may be connected to the second input terminal 1122. When the second clock signal CLK2 is supplied to the second input terminal 1122, the first transistor M1 may be turned on to electrically connect the first input terminal 1121' and the first node N1.

The second transistor M2 may be connected between the third input terminal 1123 and the first output terminal 1125. A gate electrode of the second transistor M2 may be connected to the first node N1. The second transistor M2 may control a connection between the third input terminal 1123 and the first output terminal 1125 while being turned on or turned off in response to the voltage of the first node N1.

The third transistor M3 may be connected between the first output terminal 1125 and the first power input terminal 1131. Further, a gate electrode of the third transistor M3 may be connected to the second input terminal 1122. When the second clock signal CLK2 is supplied to the second input terminal 1122, the third transistor M3 may be turned on to electrically connect the first output terminal 1125 and the first power input terminal 1131.

The fourth transistor M4" may be connected between the second output terminal 1126 and the first power input terminal 1131. Further, a gate electrode of the fourth transistor M4" may be connected to the fourth input terminal 1124'. When the $(i+2)^{th}$ carry signal CRi+2 is supplied to the fourth input terminal 1124', the fourth transistor M4" may be turned on to electrically connect the second output terminal 1126 and the first power input terminal 1131.

The fifth transistor M5 may be connected between the third input terminal 1123 and the second output terminal 1126. A gate electrode of the fifth transistor M5 may be connected to the first node N1. The fifth transistor M5 may control a connection between the third input terminal 1123 and the second output terminal 1126 while being turned on or turned off in response to the voltage of the first node N1.

The sixth transistor M6 may be connected between the second output terminal 1126 and the second power input terminal 1132. Further, a gate electrode of the sixth transistor M6 may be connected to the second input terminal 1122. When the second clock signal CLK2 is supplied to the second input terminal 1122, the sixth transistor M6 may be turned on to electrically connect the second output terminal 1126 and the second power input terminal 1132.

The first capacitor C1 may be connected between the first node N1 and the first output terminal 1125. The first capacitor C1 may control the voltage of the first node N1 (e.g., when the first transistor M1 is turned off or in response to a voltage of the first output terminal 1125).

The $i^{th}$ stage STi of FIGS. 6-7 may include the six transistors M1 to M6 and one capacitor C1. That is, the $i^{th}$ stage STi of the present invention may be implemented by a relatively simple circuit and thus, the size of a scan driver using such stages may be reduced or minimized.

Figure 8:
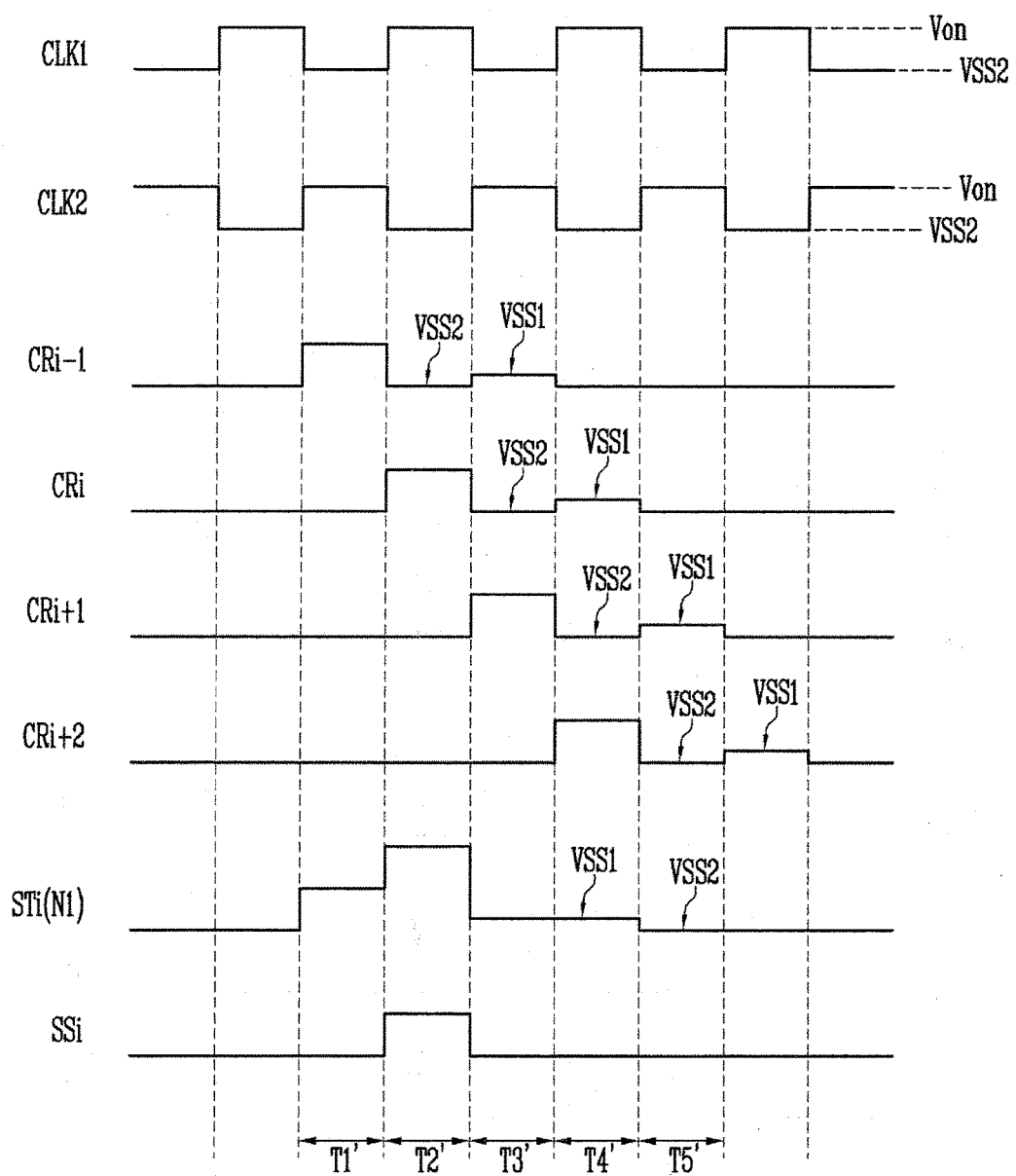
FIG. 8 is a waveform diagram illustrating an example method of driving the stage illustrated in FIG. 7 according to an embodiment of the present invention.

FIG. 8 is a waveform diagram illustrating an example method of driving the $i^{th}$ stage STi of FIG. 7 according to an embodiment of the present invention. As with FIGS. 6-7, for convenience of description, the signal waveforms of FIG. 8 are for an odd-numbered stage STi (e.g., when i is an odd number). The corresponding signal waveforms for an even-numbered stage STi+1 are similar to those of the odd-numbered stage STi, with differences discussed elsewhere and as would be apparent to one of ordinary skill.

Referring to FIGS. 7-8, phases of the first clock signal CLK1 and the second clock signal CLK2 may be reversed (e.g., the second clock signal CLK2 may have a reverse phase of the first clock signal CLK1). For example, a high section of each of the first clock signal CLK1 and the second clock signal CLK2 may be a gate on voltage Von, and a low section of each of the first clock signal CLK1 and the second clock signal CLK2 may be the second off voltage VSS2.

The $(i-1)^{th}$ carry signal CRi-1 is supplied to the first input terminal 1121' for a first period T1' and the second clock signal CLK2 is supplied to the second input terminal 1122. When the second clock signal CLK2 is supplied to the second input terminal 1122, the first transistor M1, the third transistor M3, and the sixth transistor M6 may be turned on. When the third transistor M3 is turned on, the first off voltage VSS1 may be supplied to the first output terminal 1125. When the sixth transistor M6 is turned on, the second off voltage VSS2 may be supplied to the second output terminal 1126.

When the first transistor M1 is turned on, the first input terminal 1121' and the first node N1 may be electrically connected. Accordingly, the $(i-1)^{th}$ carry signal CRi-1 may be supplied to the first node N1 during the first period T1'.

When the $(i-1)^{th}$ carry signal CRi−1 is supplied to the first node N1, the second transistor M2 and the fifth transistor M5 may be turned on.

When the second transistor M2 is turned on, the third input terminal 1123 and the first output terminal 1125 may be electrically connected. In this case, the third input terminal 1123 is the second off voltage VSS2 and thus, the $i^{th}$ scan signal SSi is not supplied to the first output terminal 1125.

When the fifth transistor M5 is turned on, the third input terminal 1123 and the second output terminal 1126 may be electrically connected. In this case, the third input terminal 1123 is the second off voltage VSS2 and thus, the $i^{th}$ carry signal CRi is not supplied to the second output terminal 1126. In addition, the first capacitor C1 stores voltages corresponding to the gate on voltage Von (that may turn-on the second transistor M2 and the fifth transistor M5) during the first period T1'.

During a second period T2', the first clock signal CLK1 is supplied to the third input terminal 1123 and the second clock signal CLK2 is not supplied to the second input terminal 1122. In this case, the first, third, and sixth transistors M1, M3, and M6 may be turned off, but the first node N1 may maintain at least the gate on voltage Von from the first capacitor C1 and thus, the second transistor M2 and the fifth transistor M5 may remain turned on, so the first clock signal CLK1 may be supplied to the first output terminal 1125 and the second output terminal 1126, and then to the $i^{th}$ scan line Si as the $i^{th}$ scan signal SSi. In addition, the first clock signal CLK1 is supplied as the $i^{th}$ carry signal CRi to the fourth input terminal 1124' of the $(i-2)^{th}$ stage STi−2 and the first input terminal 1121' of the $(i+1)^{th}$ stage STi+1.

Further, the voltage of the first node N1 may be increased to a high voltage Vhigh that is higher than the gate on voltage Von by boosting of the first capacitor C1 during the second period T2' and thus, the second transistor M2 and the fifth transistor M5 may stably remain turned on.

During a third period T3', the second clock signal CLK2 is supplied to the second input terminal 1122, so the first transistor M1, the third transistor M3, and the sixth transistor M6 may be turned on. When the first transistor M1 is turned on, the first input terminal 1121' and the first node N1 may be electrically connected, so the $(i-1)^{th}$ carry signal CRi−1 may be supplied to the first node N1. In this case, the fourth transistor M4' in the $(i-1)^{th}$ stage STi−1 is turned on by the $(i+1)^{th}$ carry signal CRi+1 supplied to the fourth input terminal 1124' of the $(i-1)^{th}$ stage and thus, the first off voltage VSS1 is supplied to the second output terminal 1126 of the $(i-1)^{th}$ stage STi−1 and then as the $(i-1)^{th}$ carry signal CRi−1. Accordingly, the first off voltage VSS1 is supplied to the first node N1 during the third period T3'.

When the third transistor M3 is turned on, the first off voltage VSS1 is supplied to the first output terminal 1125, so the voltage of the first output terminal 1125 drops from the gate on voltage Von to the first off voltage VSS1. Further, when the sixth transistor M6 is turned on (by the second clock signal CLK2), the second off voltage VSS2 is supplied to the second output terminal 1126, so the voltage of the second output terminal 1126 drops from the gate on voltage Von to the second off voltage VSS2. In addition, the voltage of the first node during the third period T3' is the first off voltage VSS1, which is higher than the second off voltage VSS2 (that is the voltage of the first and second terminals of the fifth transistor M5), which may cause the fifth transistor M5 to turn on and electrically connect the third input terminal 1123 and the second output terminal 1126.

Accordingly, the voltage (or current) of the second output terminal 1126 may be shared with the third input terminal 1123 via the turned-on fifth transistor M5 and thus, the voltage of the second output terminal 1126 may drop to a desired voltage (in this case, the second off voltage VSS2) within a short time. When the voltage of the second output terminal 1126 drops to a desired voltage within a short time, reliability improves.

During a fourth period T4', the $(i+2)^{th}$ carry signal CRi+2 is supplied to the fourth input terminal 1124', the first clock signal CLK1 is supplied to the third input terminal 1123, and the second clock signal CLK2 is not supplied to the second input terminal 1122 Accordingly, the first, third, and sixth transistors M1, M3, and M6 are turned off, and the voltage of the first node N1 remains at the first off voltage VSS1 (due to the first capacitor C1). Consequently, the second transistor M2 and the fifth transistor M5 remain turned off during the fourth period T4', so the first clock signal CLK1 is not supplied to the first output terminal 1125 and the second output terminal 1126.

Further, when the $(i+2)^{th}$ carry signal CRi+2 is supplied to the fourth input terminal 1124', the fourth transistor M4' is turned on, so the first off voltage VSS1 is supplied to the second output terminal 1126 as the $i^{th}$ carry signal and then to the first node N1 of the $(i+1)^{th}$ stage STi+1.

During a fifth period T5', the second clock signal CLK2 is supplied to the second input terminal 1122, so the first transistor M1, the third transistor M3, and the sixth transistor M6 are turned on. When the first transistor M1 is turned on, the first input terminal 1121' and the first node N1 are electrically connected. Then, the voltage of the first node N1 drops to that of the (i−1) carry signal Cri−1, namely the second off voltage VSS2.

When the third transistor M3 is turned on, the first off voltage VSS1 is supplied to the first output terminal 1125. When the sixth transistor M6 is turned on, the second off voltage VSS2 is supplied to the second output terminal 1126. In addition, each of the first to $n^{th}$ stages ST1 to STn of FIGS. 6-8 may be driven in response to the first period T1' to the fifth period T5' as discussed above.

Figure 9:
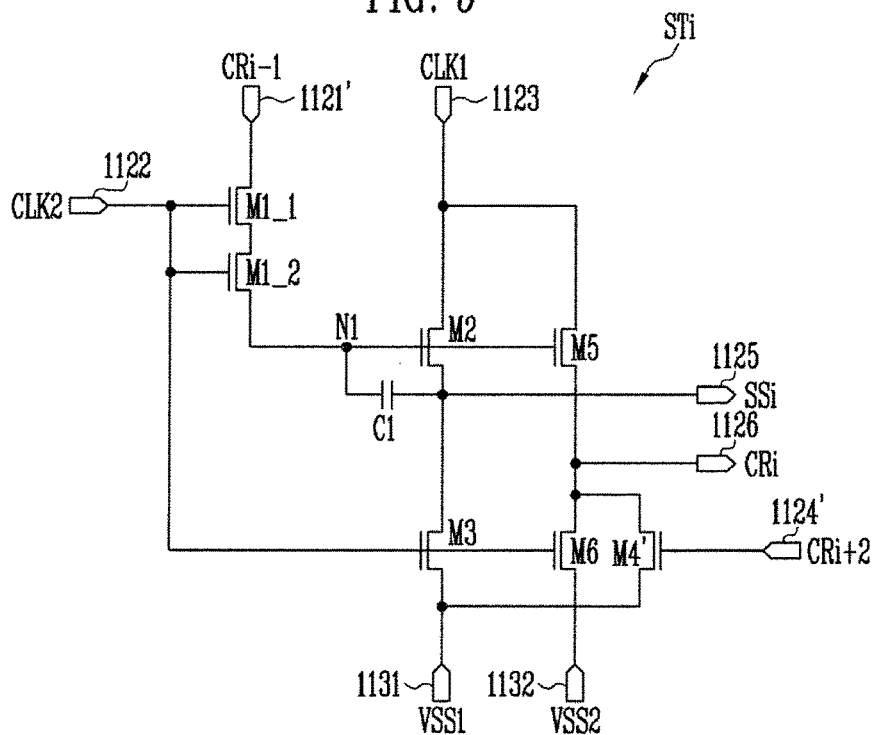
FIG. 9 is a circuit diagram illustrating an example circuit layout of the stage of FIG. 6 according to a second embodiment of the present invention.

FIG. 9 is a circuit diagram illustrating an example circuit layout of the $i^{th}$ stage STi of FIG. 6 according to a second embodiment of the present invention. As with FIGS. 6-8, for convenience of description, the stage terminals in FIG. 9 are for an odd-numbered stage STi (e.g., when i is an odd number). The corresponding set of terminals for an even-numbered stage STi+1 are similar to those of the odd-numbered stage STi, with differences discussed elsewhere and as would be apparent to one of ordinary skill. In describing FIG. 9, the same or substantially the same configuration as that of FIG. 7 is denoted with the same reference numerals, so that a detailed description thereof may not be repeated.

Referring to FIG. 9, the $i^{th}$ stage STi may include first transistors M1_1 and M1_2, a second transistor M2 to a sixth transistor M6, and a first capacitor C1. Here, the first transistors M1_1 and M1_2 may be serially connected between a first input terminal 1121' and a first node N1 to, for example, reduce or minimize current leakage of the first node N1 or reduce or minimize an erroneous operation due to degradation of the first transistors M1_1 and M1_2.

In addition, including two (or a plurality of transistors, such as more than two) serially connected first transistors M1_1 and M1_2 may be applied to other embodiments of the present invention. For example, the first transistors M1_1 and M12 may also be applied to the $i^{th}$ stage circuit STi of FIG. 4. For ease of description, the plurality of first transistors will be referred to as two first transistors or a pair of first transistors that are serially connected with each other.

Figure 10:
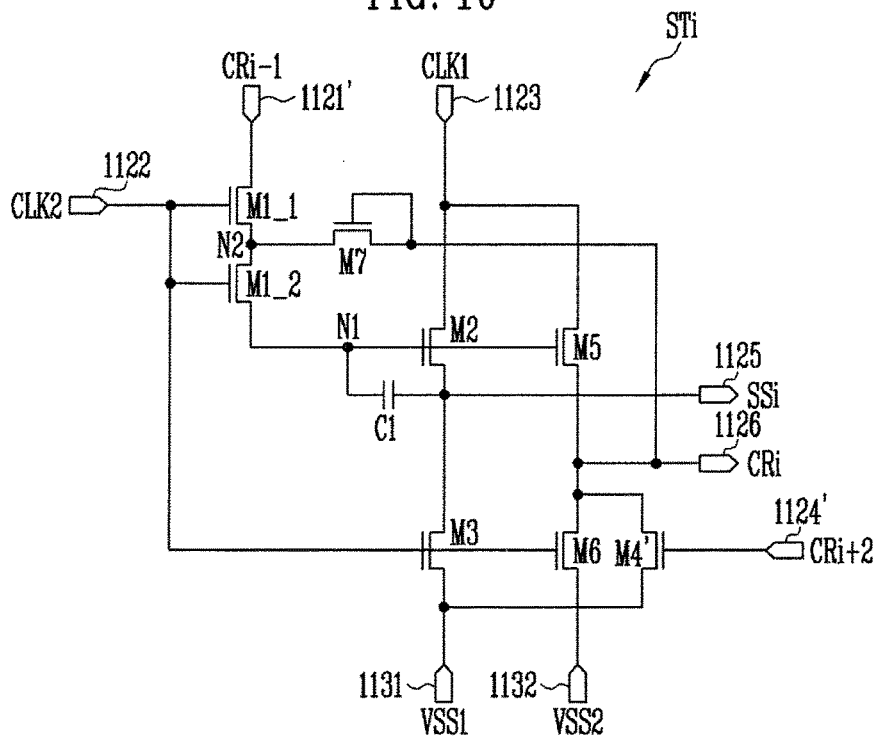
FIG. 10 is a circuit diagram illustrating an example circuit layout of the stage of FIG. 6 according to a third embodiment of the present invention.

FIG. 10 is a circuit diagram illustrating an example circuit layout of the $i^{th}$ stage STi of FIG. 6 according to a third embodiment of the present invention. As with FIGS. 6-9, for convenience of description, the stage terminals in FIG. 10 are for an odd-numbered stage STi (e.g., when i is an odd number). The corresponding set of terminals for an even-numbered stage STi+1 are similar to those of the odd-numbered stage STi, with differences discussed elsewhere and as would be apparent to one of ordinary skill. In describing FIG. 10, the same or substantially the same configuration as that of FIG. 9 is denoted with the same reference numerals, so that a detailed description thereof may not be repeated.

Referring to FIG. 10, the $i^{th}$ stage STi may include first transistors M1_1 and M1_2 to a seventh transistor M7, and a first capacitor C1.

The first transistors M1_1 and M1_2 may be in a similar configuration to that of FIG. 9, while the seventh transistor M7 may be connected between a second node N2 (that is a common node between the first transistors M1_1 and M1_2) and a second output terminal 1126. Further, a gate electrode of the seventh transistor M7 may be connected to the second output terminal 1126. That is, the seventh transistor M7 may be connected in the form of a diode so that current may flow from the second output terminal 1126 to the second node N2, but not vice versa. The seventh transistor M7 may thus reduce or minimize degradation of the first transistors M1_1 and M1_2 to improve reliability of an operation.

In addition, including the seventh transistor M7 as configured in FIG. 10 may be applied to other embodiments of the present invention in which the first transistors M1_1 and M1_2 are configured.

Figure 11:
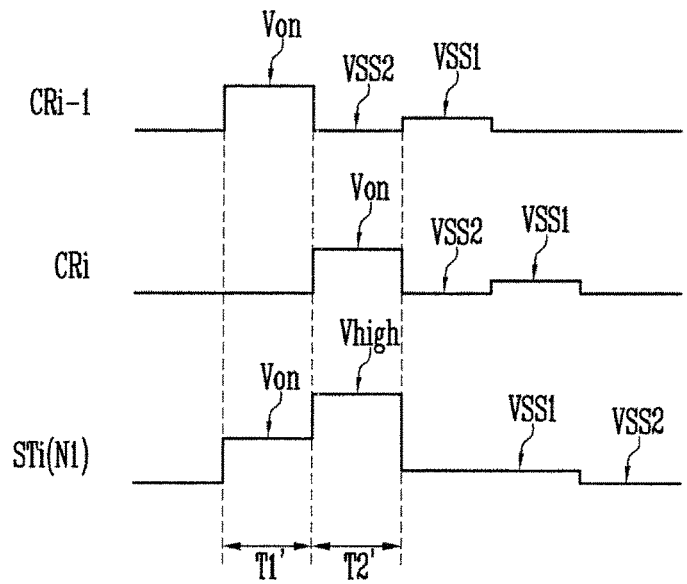
FIG. 11 is a waveform diagram illustrating an example method of driving the stage of FIG. 10 according to an embodiment of the present invention.

FIG. 11 is a waveform diagram illustrating an example method of driving the $i^{th}$ stage STi of FIG. 10 according to an embodiment of the present invention.

Referring to FIG. 11, a $(i-1)^{th}$ carry signal CRi−1 is supplied to a first input terminal 1121' for a first period T1' while the second clock signal CLK2 is supplied to the second input terminal 1122 and thus, the first node N1 and the second node N2 are supplied with a gate on voltage Von. Then, during a second period T2', the first input terminal 1121' is supplied with a second off voltage VSS2 and the first node N1 is boosted to a high voltage Vhigh (that is higher than the gate on voltage Von) by the first capacitor C1 when the first clock signal CLK1 is supplied to the first output terminal 1125 as the $i^{th}$ scan signal SSi and to the second output terminal 1126 as the $i^{th}$ carry signal CRi. Then, the second node N2 is supplied with the gate on voltage Von by the seventh transistor M7.

Accordingly, the (first) first transistor M1_1 receives the second off voltage VSS2 and the gate on voltage Von at its first and second electrodes during the second period T2' while the (second) first transistor M1_2 receives the gate on voltage Von and the high voltage Vhigh at its first and second electrodes during the second period T2'. Thus, degradation of the first transistors M1_1 and M1_2 may be reduced or minimized during the second period T2', thereby securing reliability.

In further detail, when the seventh transistor M7 and its connections are no longer present, a single first transistor M1 or the pair of first transistors M1_1 and M1_2 receive the second off voltage VSS2 at one end and the high voltage Vhigh at another end during the second period T2'. In this case, the first transistor M1 or the first transistors M1_1 and M1_2 may be more easily degraded by a (large) voltage difference between the second off voltage VSS2 and the high voltage Vhigh. In contrast, in FIG. 10, it is possible to reduce or minimize the degradation of the first transistor M1 or the pair of first transistors M1_1 and M1_2 by using the pair of first transistors M1_1 and M1_2 and supplying the (intermediate) gate on voltage Von to the second node N2 during the second period T2'.

Figure 12:
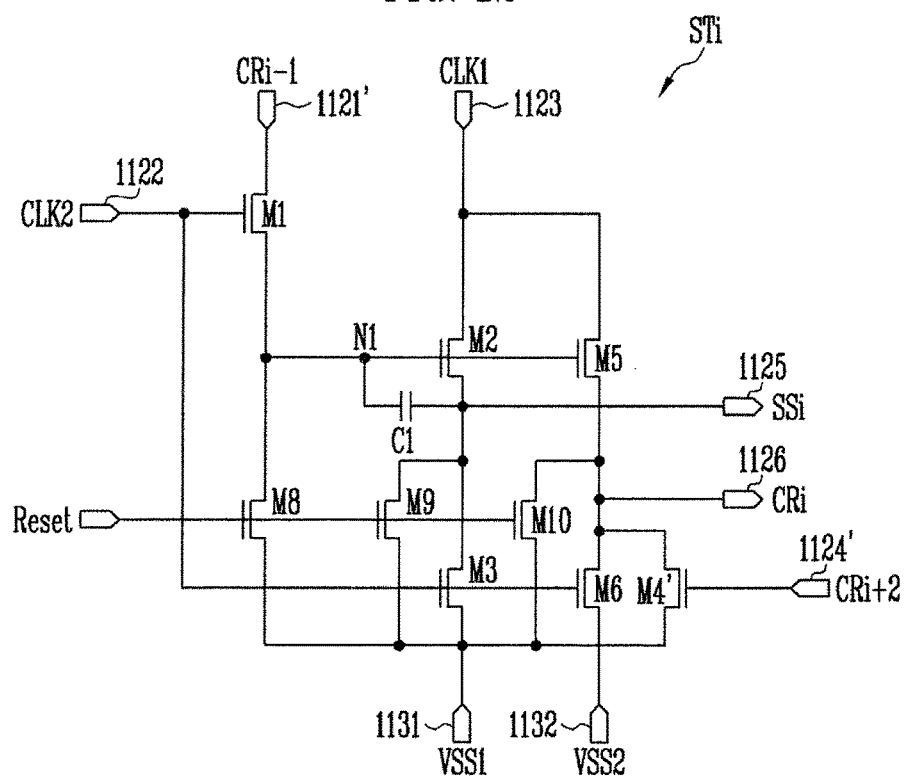
FIG. 12 is a circuit diagram illustrating an example circuit layout of the stage of FIG. 6 according to a fourth embodiment of the present invention.
Figure 13:
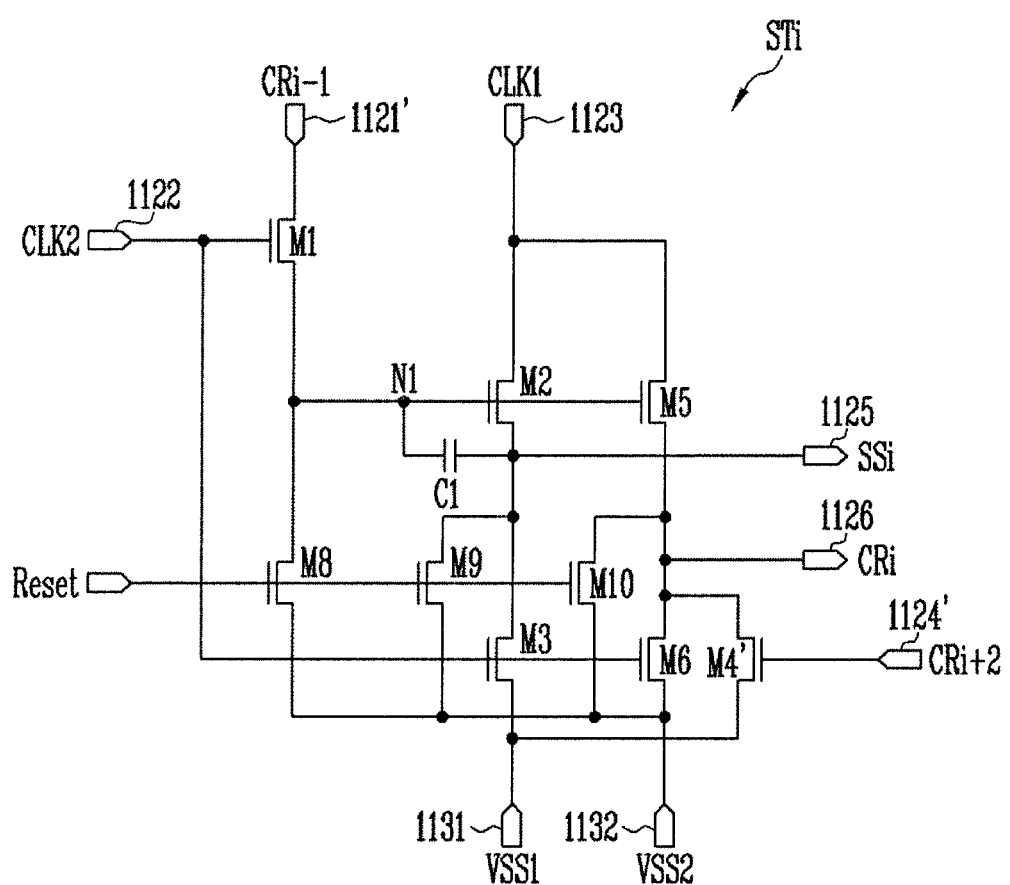
FIG. 13 is a circuit diagram illustrating an example circuit layout of the stage of FIG. 6 according to a fifth embodiment of the present invention.

FIG. 12 is a circuit diagram illustrating an example circuit layout of the $i^{th}$ stage STi illustrated in. FIG. 6 according to a fourth embodiment of the present invention. FIG. 13 is a circuit diagram illustrating an example circuit layout of the $i^{th}$ stage STi illustrated in FIG. 6 according to a fifth embodiment of the present invention. As with FIGS. 6-9 and 11, for convenience of description, the stage terminals in FIGS. 12-13 are for an odd-numbered stage STi (e.g., when i is an odd number). The corresponding set of terminals for an even-numbered stage STi+1 are similar to those of the odd-numbered stage STi, with differences discussed elsewhere and as would be apparent to one of ordinary skill. In describing FIGS. 12-13, the same or substantially the same configuration as that of FIG. 7 is denoted with the same reference numerals, so that a detailed description thereof may not be repeated.

Referring to FIG. 12, the $i^{th}$ stage STi may include a first transistor M1 to a sixth transistor M6, an eighth transistor M8 to a tenth transistor M10, and a first capacitor C1. The eighth transistor M8 is connected between a first node N1 and a first power input terminal 1131, and a gate electrode of the eighth transistor M8 is connected to a reset input terminal (Reset). When a reset signal is supplied to the reset input terminal, the eighth transistor M8 may be turned on to supply the first off voltage VSS1 to the first node N1.

The ninth transistor M9 is connected between the first output terminal 1125 and the first power input terminal 1131, and a gate electrode of the ninth transistor M9 is connected to the reset input terminal. When the reset signal is supplied to the reset input terminal, the ninth transistor M9 may be turned on to supply the first off voltage VSS1 to the first output terminal 1125.

The tenth transistor M10 is connected between a second output terminal 1126 and the first power input terminal 1131, and a gate electrode of the tenth transistor M10 is connected to the reset input terminal. When the reset signal is supplied to the reset input terminal, the tenth transistor M10 may be turned on to supply the first off voltage VSS1 to the second output terminal 1126.

The aforementioned eighth transistor M8 to tenth transistor M10 may be used to initialize the first to $n^{th}$ stages ST1 to STn included in the scan driver 110 to a specific state. For example, when the reset signal is supplied, the first off voltage VSS1 is supplied to the first node N1, the first output terminal 1125, and the second output terminal 1126 of each of the first to $n^{th}$ stages ST1 to STn.

In another embodiment, the eighth transistor M8 to the tenth transistor M10 may be connected to a second power input terminal 1132 (supplying the second off voltage VSS2) as illustrated in FIG. 13. In this case, the second off voltage VSS2 may be supplied to the first node N1, the first output terminal 1125, and the second output terminal 1126 in response to the reset signal.

In addition, the eighth transistor M8 to the tenth transistor M10 of FIGS. 12 and 13 may be applied to other embodiments of the present invention, such as those already described. Further, the eighth transistor M8 to the tenth transistor M10 of FIGS. 12-13 may be combined, such as supplying the first off voltage VSS1 to the first output terminal 1125 and the second off voltage VSS2 to the first node N1 and the second output terminal 1126 in response to the reset signal.

Figure 14:
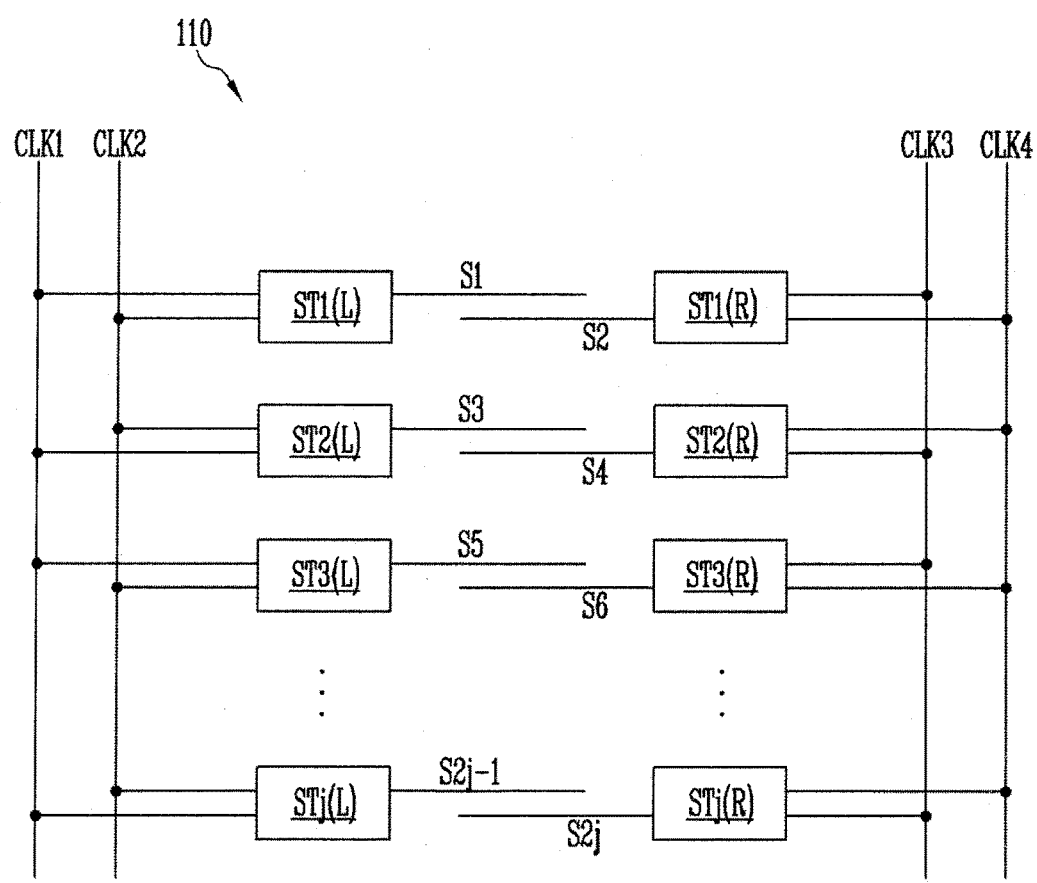
FIG. 14 is a block diagram illustrating an example scan driver of FIG. 1 according to another embodiment of the present invention.

FIG. 14 is a block diagram illustrating an example scan driver 110 of FIG. 1 according to another embodiment of the present invention. The stages of FIG. 14 may be formed at two sides (e.g., opposite sides) of a panel, but a substantial circuit configuration and operation process thereof is similar to those of the aforementioned embodiments and thus, different characteristics thereof will mainly be described.

Referring to FIG. 14, the scan driver 110 includes first to $j^{th}$ left stages ST1(L) to STj(L) positioned at one side of a panel and first to $j^{th}$ right stages ST1(R) to STj(R) positioned at another side of the panel. The first to $j^{th}$ left stages ST1(L) to STj(L) are respectively connected to the odd-numbered scan lines S1 to S2$j$−1. The first to $j^{th}$ left stages ST1(L) to STj(L) supply scan signals to the odd-numbered scan lines S1 to S2$j$−1 in response to a first clock signal CLK1 and a second clock signal CLK2.

In contrast, the first to $j^{th}$ right stages ST1(R) to STj(R) are respectively connected to the even-numbered scan lines S2 to S2$j$. The first to $j^{th}$ right stages ST1(R) to STj(R) supply scan signals to the even-numbered scan lines S2 to S2$j$ in response to a third clock signal CLK3 and a fourth clock signal CLK4.

The first clock signal CLK1 and the second clock signal CLK2 may be signals for which their phases are reversed. For example, they may be square wave signals having a high section during a 2 horizontal period 2H (e.g., a high section of two horizontal periods) and a low section during another 2 horizontal period 2H (e.g., a low section of two horizontal periods).

Likewise, the third clock signal CLK3 and the fourth clock signal CLK4 may also be signals whose phases are reversed. For example, they may be square wave signals having a high section during yet another 2 horizontal period 2H and a low section during still yet another 2 horizontal period 2H. For instance, the third clock signal CLK3 may lag from the first clock signal CLK1 by a phase of one horizontal period 1H, while the fourth clock signal CLK4 may lag from the second clock signal CLK2 by a phase of one horizontal period 1H. Each of the first to fourth clock signals CLK1 to CLK4 may have a cycle including a high section of two horizontal periods and a low section of two horizontal periods.

Figure 15:
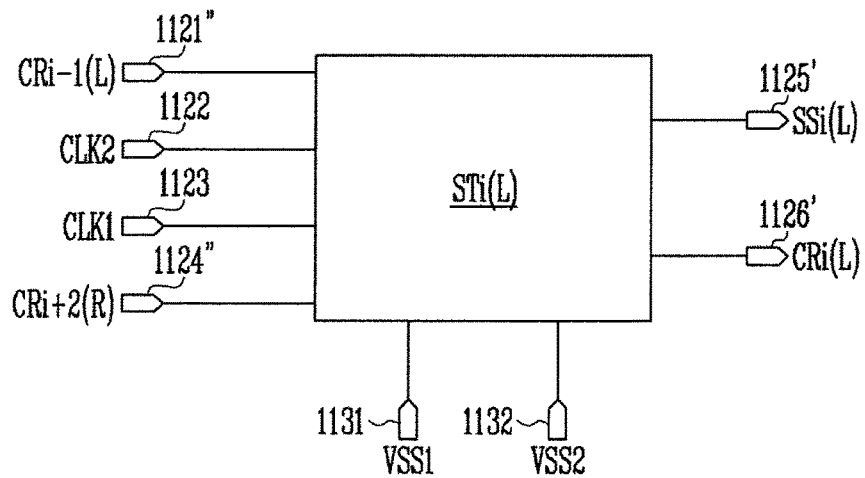
FIG. 15 is a block diagram illustrating an example set of stage terminals of a scan driver stage of FIG. 14 according to an embodiment of the present invention.

The first to $j^{th}$ left and right stages ST1(L) to STj(L) and ST1(R) to STj(R) may include second input terminals 1122 and third input terminals 1123 as illustrated in FIG. 15. Here, when the second clock signal CLK2 is input to the second input terminal 1122 of the $i^{th}$ left stage STi(L) (e.g., an odd left stage, such as when i is an odd number) and the first clock signal CLK1 is input to the third input terminal 1123 of the $i^{th}$ left stage STi(L), the first clock signal CLK1 is input to the second input terminal 1122 of the (i−1)$^{th}$ left stage STi−1(L) (e.g., an even left stage) and the second clock signal CLK2 is input to the third input terminal 1123 of the (i−1)$^{th}$ left stage STi−1(L).

Further, when the fourth clock signal CLK4 is input to the second input terminal 1122 of the $i^{th}$ right stage STi(R) (e.g., an odd stage, such as when i is an odd number) and the third clock signal CLK3 is input to the third input terminal 1123 of the $i^{th}$ right stage STi(R), the third clock signal CLK3 is input to the second input terminal 1122 of the (i−1)$^{th}$ right stage STi−1(R) and the fourth clock signal CLK4 is input to the third input terminal 1123 of the of the (i−1)$^{th}$ right stage STi−1(R).

FIG. 15 is a block diagram illustrating an example set of the stage terminals of an $i^{th}$ left scan driver stage STi(L) of FIG. 14. For convenience of description, the stage terminals in FIG. 15 are for an odd-numbered left stage STi(L) (e.g., when i is an odd number). The corresponding set of terminals for an even-numbered left stage STi+1(L) as well as for odd- and even-numbered right stages STi(R) and STi+1(R) are similar to those of the odd-numbered left stage STi(L), with differences discussed elsewhere and as would be apparent to one of ordinary skill.

Referring to FIG. 15, the $i^{th}$ left stage STi(L) includes a first input terminal 1121", a second input terminal 1122, a third input terminal 1123, a fourth input terminal 1124", a first output terminal 1125', a second output terminal 1125', a first power input terminal 1131, and a second power input terminal 1132. The first input terminal 1121" receives a left (i−1)$^{th}$ carry signal CRi−1(L) from the left (i−1)$^{th}$ stage STi−1(L). The second input terminal 1122 receives a second clock signal CLK2. The third input terminal 1123 receives a first clock signal CLK1. The fourth input terminal 1124" receives a (i+2)$^{th}$ right carry signal CRi+2(R) from the (i+2)$^{th}$ right stage STi+2(R). It should be noted that in the first to $j^{th}$ right stages ST1(R) to STj(R), the fourth input terminal 1124" receives a (i+3)$^{th}$ left carry signal CRi+3(L) from the (i+3)$^{th}$ left stage STi+3(L).

Continuing with the description of FIG. 15, the first output terminal 1125' outputs an $i^{th}$ left scan signal SSi(L) of the $i^{th}$ left stage STi(L). The second output terminal 1126' outputs an $i^{th}$ left carry signal CRi(L) of the $i^{th}$ left stage STi(L). The first power input terminal 1131 receives a first off voltage VSS1. The second power input terminal 1132 receives a second off voltage VSS2.

Figure 16:
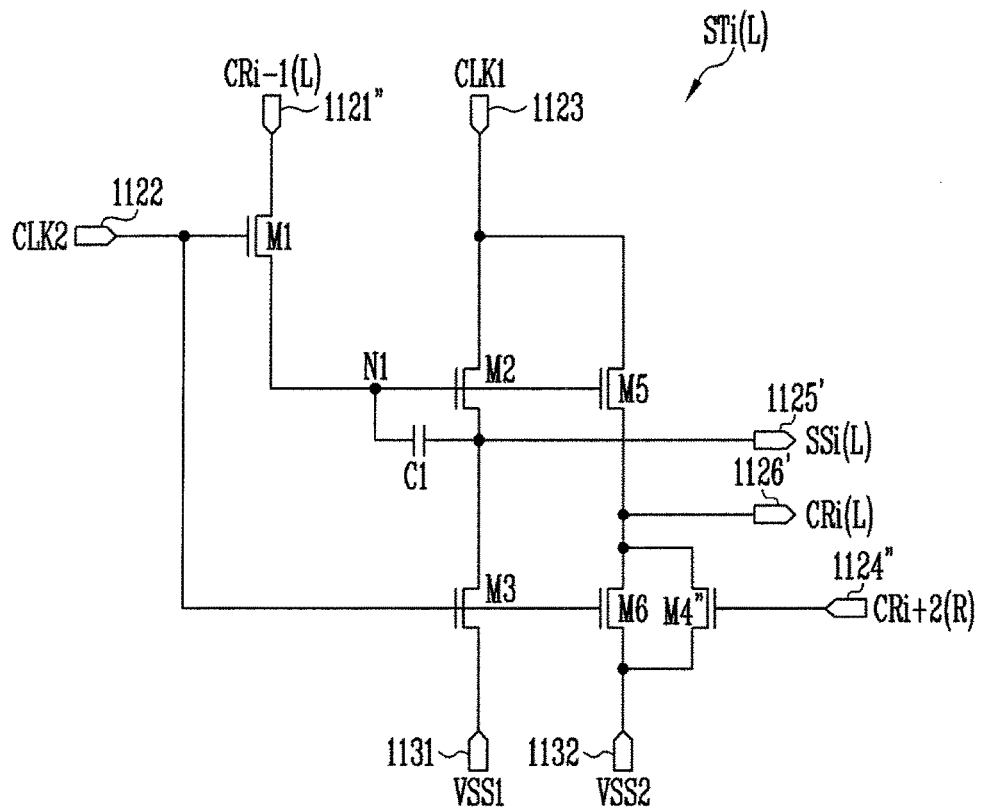
FIG. 16 is a circuit diagram illustrating an example circuit layout of the stage of FIG. 15 according to an embodiment of the present invention.

FIG. 16 is a circuit diagram illustrating an example circuit layout of the $i^{th}$ left stage STi(L) of FIG. 15 according to an embodiment of the present invention. As with FIGS. 14-15, for convenience of description, the stage terminals in FIG. 16 are for an odd-numbered left stage STi(L) (e.g., when i is an odd number). The corresponding set of terminals for an even-numbered left stage STi+1(L) as well as for odd- and even-numbered right stages STi(R) and STi+1(R) are similar to those of the odd-numbered left stage STi, with differences discussed elsewhere and as would be apparent to one of ordinary skill.

The configuration of FIG. 16, except for a fourth transistor M4", is substantially the same as that of the stage circuit of FIG. 7. That is, only signals of first through fourth input terminals 1121", 1122, 1123, and 1124", and first and second output terminals 1125' and 1126' are partially changed, but the circuit configuration of the $i^{th}$ left stage STi(L) of FIG. 16 is similar to that of the $i^{th}$ stage STi of FIG. 7. Accordingly, the same or substantially the same configuration as that of FIG. 7 is denoted with the same reference numerals, so that a detailed description thereof may not be repeated.

Referring to FIG. 16, the $i^{th}$ left stage STi(L) may include a first transistor M1 to a sixth transistor M6 and a first capacitor C1. The fourth transistor M4" is connected between a second output terminal 1126' and a second power input terminal 1132. Further, a gate electrode of the fourth transistor M4" is connected to the fourth input terminal 1124". When the (i+2)$^{th}$ right carry signal CRi+2(R) is supplied to the fourth input terminal 1124", the fourth transistor M4" may be turned on to electrically connect the second output terminal 1126' and the second power input terminal 1132.

FIG. 17 is a waveform diagram illustrating an example method of driving the $i^{th}$ left stage STi(L) of FIG. 16 according to an embodiment of the present invention. As with FIGS. 15-16, for convenience of description, the signal waveforms of FIG. 17 are for an odd-numbered left stage STi(L) (e.g., when i is an odd number). The corresponding signal waveforms for an even-numbered left stage STi+1(L) as well as for the odd- and even-numbered right stages STi(R) and STi+1(R) are similar to those of the odd-numbered left stage STi(L), with differences discussed elsewhere and as would be apparent to one of ordinary skill.

Referring to FIGS. 16-17, the $(i-1)^{th}$ left carry signal CRi−1(L) is supplied to the first input terminal 1121" for an $11^{th}$ period T11, the second clock signal CLK2 is supplied to the second input terminal 1122, and the first clock signal CLK1 is not supplied to the third input terminal 1123. When the second clock signal CLK2 is supplied to the second input terminal 1122, the first transistor M1, the third transistor M3, and the sixth transistor M6 may be turned on. When the third transistor M3 is turned on, the first off voltage VSS1 may be supplied to the first output terminal 1125'. When the sixth transistor M6 is turned on, the second off voltage VSS2 may be supplied to the second output terminal 1126'.

When the first transistor M1 is turned on, the first input terminal 1121" and the first node N1 may be electrically connected. Then, the $(i-1)^{th}$ left carry signal CRi−1(L) is supplied to the first node N1 during the $11^{th}$ period T11. When the $(i-1)^{th}$ left carry signal CRi−1(L) is supplied to the first node N1, the second transistor M2 and the fifth transistor M5 may be turned on.

When the second transistor M2 is turned on, the third input terminal 1123 and the first output terminal 1125' may be electrically connected. When the fifth transistor M5 is turned on, the third input terminal 1123 and the second output terminal 1126' may be electrically connected.

During a $12^{th}$ period T12, the first clock signal CLK1 is supplied to the third input terminal 1123, but the second clock signal CLK2 is not supplied to the second input terminal 1122. In this case, the first, third, and sixth transistors M1, M3, and M6 may be turned off, but the first node N1 may maintain at least the gate on voltage Von from the first capacitor C1 and thus, the second transistor M2 and the fifth transistor M5 may remain turned on, so the first clock signal CLK1 may be supplied to the first output terminal 1125' and the second output terminal 1126', and then as the $i^{th}$ left scan signal SSi(L).

In addition, the first clock signal CLK1 is output as the $i^{th}$ left carry signal CRi(L) to the fourth input terminal 1124" of the $(i-3)^{th}$ right stage STi−3(R) and the first input terminal 1121" of the $(i+1)^{th}$ left stage STi+1(L). By way of comparison, for the $i^{th}$ right stage STi(R), the first clock signal CLK1 is output as the $i^{th}$ right carry signal CRI(R) to the fourth input terminal 1124" of the $(i-2)^{th}$ left stage STi−2(L) and the first input terminal 1121" of the $(i+1)^{th}$ right stage STi+1(R).

Further, the voltage of the first node N1 may be increased to a high voltage Vhigh that is higher than the gate on voltage Von by boosting of the first capacitor C1 during the $12^{th}$ period T12 and thus, the second transistor M2 and the fifth transistor M5 may stably remain turned on.

During a $13^{th}$ period T13, the second clock signal CLK2 is supplied to the second input terminal 1122, so the first transistor M1, the third transistor M3, and the sixth transistor M6 may be turned on. When the first transistor M1 is turned on, the first input terminal 1121" and the first node N1 may be electrically connected, so the $(i-1)^{th}$ left carry signal CRi−1(L) may be supplied to the first node N1. In this case, the second output terminal 1126' of the $(i-1)^{th}$ left stage STi−1(L) connected to the first input terminal 1121" is in a floating state and thus, the first node N1 in the $i^{th}$ left stage STi(L) drops to a voltage Vfloat slightly lower than the gate on voltage Von. Here, the voltage of the first node N1 (Vfloat) may be a higher voltage than the first off voltage VSS1 and the second off voltage VSS2, which may cause the second and fifth transistors M2 and M5 to turn on and electrically connect the third input terminal 1123 with the first and second output terminals 1125' and 1126'.

When the third transistor M3 is turned on, the first off voltage VSS1 is supplied to the first output terminal, so the voltage of the first output terminal 1125' drops from the gate on voltage Von to the first off voltage VSS1. In addition, since the first node N1 is a higher voltage than the first off voltage VSS1, the voltage (or current) of the first output terminal 1125' may be shared with the third input terminal 1123 via the turned-on second transistor M2. Accordingly, the first output terminal 1125' may be set to a desired voltage (in this case, the first off voltage VSS1) within a short time, which may improve reliability of an operation.

Further, when the sixth transistor M6 is turned on (by the second clock signal CLK2), the second off voltage VSS2 is supplied to the second output terminal 1126', so the voltage of the second output terminal 1126' drops from the gate on voltage Von to the second off voltage VSS2. In addition, since the first node N1 is a higher voltage than the second off voltage VSS2, the voltage (or current) of the second output terminal 1126' may be shared with the third input terminal 1123 via the turned-on fifth transistor M5. Accordingly, the second output terminal 1126' may be set to a desired voltage (in this case, the second off voltage VSS2) within a short time, which may improve reliability of an operation.

During a $14^{th}$ period T14, the $(i+1)^{th}$ right carry signal CRi+1(R) is supplied to the fourth transistor M4" of the $(i-1)^{th}$ left stage STi−1(L). Accordingly, the fourth transistor M4" of the $(i-1)^{th}$ left stage STi−1(L) turns on, so the second off voltage VSS2 is supplied to the second output terminal 1126' of the $(i-1)^{th}$ left stage STi−1(L) as the $(i-1)^{th}$ left carry signal CRi−1(L). At this point, the voltage of the first node N1 of the $i^{th}$ left stage STi(L) drops to the second off voltage VSS2.

In general, each of the first to $j^{th}$ left and right stages ST1(L) to STj(L) and ST1(R) to STj(R) may be driven in response to the $11^{th}$ period T11 to the $14^{th}$ period T14 as discussed above.

Example embodiments of the present invention have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims, and their equivalents.

What is claimed is:

1. A scan driver comprising:
a plurality of stages configured to supply scan signals to scan lines, an $i^{th}$ (i is a natural number) stage of the stages at one side of a panel and comprising:
a first transistor connected between a first input terminal and a first node, and comprising a gate electrode connected to a second input terminal;

a second transistor connected between a third input terminal and a first output terminal for outputting an $i^{th}$ scan signal of the scan signals, and comprising a gate electrode connected to the first node;

a third transistor connected between the first output terminal and a first power input terminal configured to receive a first off voltage, and comprising a gate electrode connected to the second input terminal; and a first capacitor connected between the first node and the first output terminal.

2. The scan driver of claim 1, wherein in the $i^{th}$ stage, the third input terminal is configured to receive a first clock signal and the second input terminal is configured to receive a second clock signal, and in a $(i-1)^{th}$ stage of the stages, the second input terminal is configured to receive the first clock signal and the third input terminal is configured to receive the second clock signal.

3. The scan driver of claim 2, wherein a phase of the first clock signal is reversed from a phase of the second clock signal.

4. The scan driver of claim 1, wherein the $i^{th}$ stage further comprises a fourth transistor connected between the first output terminal and the first power input terminal, and comprising a gate electrode connected to a fourth input terminal.

5. The scan driver of claim 4, wherein the first input terminal is configured to receive a $(i-1)^{th}$ scan signal of the scan signals from a $(i-1)^{th}$ stage of the stages, and the fourth input terminal is configured to receive a $(i+2)^{th}$ scan signal of the scan signals from a $(i+2)^{th}$ stage of the stages.

6. The scan driver of claim 1, wherein the stages are further configured to supply carry signals, and the $i^{th}$ stage further comprises:

a fourth transistor connected between the first power input terminal and a second output terminal for outputting an $i^{th}$ carry signal of the carry signals, and comprising a gate electrode connected to a fourth input terminal;

a fifth transistor connected between the third input terminal and the second output terminal, and comprising a gate electrode connected to the first node; and a sixth transistor connected between the second output terminal and a second power input terminal configured to receive a second off voltage, and comprising a gate electrode connected to the second input terminal.

7. The scan driver of claim 6, wherein the first off voltage and the second off voltage are the same voltage.

8. The scan driver of claim 6, wherein the second off voltage is a lower voltage than the first off voltage.

9. The scan driver of claim 8, wherein the first input terminal is configured to receive a $(i-1)^{th}$ carry signal of the carry signals from a $(i-1)^{th}$ stage of the stages, the third input terminal is configured to receive a first clock signal, the second input terminal is configured to receive a second clock signal, and the fourth input terminal is configured to receive a $(i+2)^{th}$ carry signal of the carry signals from a $(i+2)^{th}$ stage of the stages.

10. The scan driver of claim 9, wherein the first clock signal and the second clock signal are signals having reversed phases, and alternating between a gate on voltage during a high section and the second off voltage during a low section.

11. The scan driver of claim 6, wherein the first transistor comprises a plurality of transistors serially connected together.

12. The scan driver of claim 11, wherein the $i^{th}$ stage further comprises a seventh transistor connected between a second node between the plurality of transistors and the second output terminal, and comprising a gate electrode connected to the second output terminal.

13. The scan driver of claim 6, wherein the $i^{th}$ stage further comprises:

an eighth transistor connected between the first node and the first power input terminal or the second output terminal, and comprising a gate electrode connected to a reset input terminal;

a ninth transistor connected between the first output terminal and the first power input terminal or the second output terminal, and comprising a gate electrode connected to the reset input terminal; and a tenth transistor connected between the second output terminal and the first power input terminal or the second output terminal, and comprising a gate electrode connected to the reset input terminal.

14. The scan driver of claim 1, wherein the stages comprise:

left stages at the one side of the panel and connected to odd-numbered ones of the scan lines; and right stages at another side of the panel and connected to even-numbered ones of the scan lines.

15. The scan driver of claim 14, wherein the left stages are configured to be driven by a first clock signal and a second clock signal that has a reverse phase of the first clock signal, and the right stages are configured to be driven by a third clock signal that lags the first clock signal by one horizontal period, and a fourth clock signal that has a reverse phase of the third clock signal.

16. The scan driver of claim 15, wherein one cycle of each of the first clock signal, the second clock signal, the third clock signal, and the fourth clock signal comprises a high section of two horizontal periods and a low section of two horizontal periods.

17. The scan driver of claim 15, wherein in an $i^{th}$ left stage of the left stages, the second input terminal is configured to receive the second clock signal and the third input terminal is configured to receive the first clock signal, in a $(i-1)^{th}$ left stage of the left stages, the second input terminal is configured to receive the first clock signal and the third input terminal is configured to receive the second clock signal, in an $i^{th}$ right stage of the right stages, the second input terminal is configured to receive the fourth clock signal and the third input terminal is configured to receive the third clock signal, and in a $(i-1)^{th}$ right stage of the right stages, the second input terminal is configured to receive the third clock signal and the third input terminal is configured to receive the fourth clock signal.

18. The scan driver of claim 14, wherein
the stages are further configured to supply carry signals, and
an $i^{th}$ left stage of the left stages further comprises:
- a fourth transistor connected between a second output terminal for outputting an $i^{th}$ left carry signal of the carry signals and a second power input terminal configured to receive a second off voltage, and comprising a gate electrode connected to a fourth input terminal;
- a fifth transistor connected between the third input terminal and the second output terminal, and comprising a gate electrode connected to the first node; and
- a sixth transistor connected between the second output terminal and the second power input terminal, and comprising a gate electrode connected to the second input terminal.

19. The scan driver of claim 18, wherein the second off voltage is a lower voltage than the first off voltage.

20. The scan driver of claim 18, wherein
the first input terminal is configured to receive a $(i-1)^{th}$ left carry signal of the carry signals from a $(i-1)^{th}$ left stage of the left stages, and
the fourth input terminal is configured to receive a $(i+2)^{th}$ right carry signal of the carry signals from a $(i+2)^{th}$ right stage of the right stages.

* * * * *